(12) United States Patent
Iguchi et al.

(10) Patent No.: US 10,453,687 B2
(45) Date of Patent: Oct. 22, 2019

(54) METHOD OF MANUFACTURING SEMICONDUCTOR DEVICE

(71) Applicant: Fuji Electric Co., Ltd., Kanagawa (JP)

(72) Inventors: Kenichi Iguchi, Nagano (JP); Haruo Nakazawa, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/001,159

(22) Filed: Jun. 6, 2018

(65) Prior Publication Data

US 2019/0019679 A1    Jan. 17, 2019

(30) Foreign Application Priority Data

Jul. 12, 2017 (JP) .................. 2017-136611

(51) Int. Cl.

| | | |
|---|---|---|
| *H01L 21/225* | (2006.01) | |
| *H01L 21/268* | (2006.01) | |
| *H01L 21/04* | (2006.01) | |
| *H01L 29/66* | (2006.01) | |
| *H01L 29/861* | (2006.01) | |
| *H01L 29/872* | (2006.01) | |
| *H01L 29/739* | (2006.01) | |
| *H01L 21/285* | (2006.01) | |
| *H01L 29/812* | (2006.01) | |

(Continued)

(52) U.S. Cl.
CPC ........ *H01L 21/2254* (2013.01); *H01L 21/046* (2013.01); *H01L 21/0455* (2013.01); *H01L 21/0485* (2013.01); *H01L 21/0495* (2013.01); *H01L 21/268* (2013.01); *H01L 21/28512* (2013.01); *H01L 29/6606* (2013.01); *H01L 29/66053* (2013.01); *H01L 29/66068* (2013.01); *H01L 29/7395* (2013.01); *H01L 29/8611* (2013.01); *H01L 29/872* (2013.01); *H01L 29/0619* (2013.01); *H01L 29/1095* (2013.01); *H01L 29/1608* (2013.01); *H01L 29/45* (2013.01); *H01L 29/7393* (2013.01); *H01L 29/7827* (2013.01); *H01L 29/8122* (2013.01)

(58) Field of Classification Search
CPC ................ H01L 21/0455; H01L 21/225–2257
See application file for complete search history.

(56) References Cited

U.S. PATENT DOCUMENTS 3,986,193 A * 10/1976 Vodakov ............... H01L 33/343
257/77
5,710,059 A * 1/1998 Rottner ................. H01L 21/046
257/E21.057

(Continued)

FOREIGN PATENT DOCUMENTS

JP    H08-264468 A    10/1996
JP    2002-518828 A    6/2002

(Continued)

*Primary Examiner* — Bryan R Junge
(74) *Attorney, Agent, or Firm* — Chen Yoshimura LLP

(57) ABSTRACT

A method of manufacturing a semiconductor device includes: forming, on a surface of an n-type semiconductor layer, an impurity source film containing both aluminum and beryllium; and forming a p-type impurity-doped layer in the n-type semiconductor layer by irradiating the impurity source film with first laser light to simultaneously introduce the aluminum and the beryllium into the n-type semiconductor layer.

16 Claims, 26 Drawing Sheets

(51) Int. Cl.
  *H01L 29/78*    (2006.01)
  *H01L 29/16*    (2006.01)
  *H01L 29/45*    (2006.01)
  *H01L 29/06*    (2006.01)
  *H01L 29/10*    (2006.01)

(56) References Cited

U.S. PATENT DOCUMENTS

| | | |
|---|---|---|
| 6,100,169 A | 8/2000 | Suvorov et al. |
| 6,107,142 A | 8/2000 | Suvorov et al. |
| 2004/0217457 A1* | 11/2004 | Sudarshan .......... H01L 21/0455 257/678 |
| 2011/0017998 A1 | 1/2011 | Nakano et al. |
| 2013/0126906 A1* | 5/2013 | Tomita .................... C30B 25/02 257/77 |
| 2015/0028350 A1 | 1/2015 | Suvorov et al. |
| 2015/0354090 A1* | 12/2015 | Tomita .................... C30B 25/02 117/89 |
| 2016/0315169 A1 | 10/2016 | Yoshikawa et al. |
| 2017/0092758 A1 | 3/2017 | Ueno |

FOREIGN PATENT DOCUMENTS

| | | |
|---|---|---|
| JP | 2002-519851 A | 7/2002 |
| JP | 2009-054765 A | 3/2009 |
| JP | 2011-100967 A | 5/2011 |
| JP | 2012-146858 A | 8/2012 |
| JP | 2016-530712 A | 9/2016 |
| JP | 6032337 B1 | 11/2016 |
| JP | 2016-207881 A | 12/2016 |

* cited by examiner

METHOD OF MANUFACTURING SEMICONDUCTOR DEVICE

BACKGROUND OF THE INVENTION

Technical Field

The present invention relates to a method of manufacturing a semiconductor device.

Background Art

Semiconductor devices using silicon carbide (SiC) and more particularly 4H silicon carbide (4H-SiC) have attracted attention as power semiconductors. In 4H-SiC semiconductor devices, first, a crystalline layer of 4H-SiC of a desired impurity concentration is epitaxially grown on a high-impurity concentration (impurity density) $n^+$ 4H-SiC semiconductor substrate, for example. Then, impurity elements are introduced into the crystalline layer of 4H-SiC by implanting ions of an n-type impurity element such as phosphorus (P) or a p-type impurity element such as aluminum (Al) or boron (B) into the (0001) plane or the (000-1) plane of the crystalline layer. Forming impurity-doped layers of the desired conductivity types and impurity concentrations within the crystalline layer makes it possible to manufacture a semiconductor device having the desired device structure. Patent Document 1, for example, discloses a vertical SiC device in which deep $p^+$ implantation regions are formed by ion-implanting beryllium (Be) as a p-type impurity element.

During this ion implantation process, the ions are implanted at a high dosage of greater than or equal to approximately $10^{15}/cm^2$, for example. In 4H-SiC, the diffusion coefficient of impurity elements is extremely small in comparison to in silicon (Si) or the like. Therefore, the ion implantation process is performed multiple times at different depths by varying the ion implantation acceleration voltage in order to form the desired impurity distribution. Moreover, in order to promote activation of the implanted impurity elements, it is necessary to heat the semiconductor substrate to increase the temperature to approximately 300 to 800° C. before ion implantation. Another objective of this pre-implantation heat treatment is to reduce distortion of the crystal structure of the semiconductor device due to ions being implanted at high speed. Such distortions in the crystal structure tend to expand as crystal defects as the implantation concentration increases. This pre-implantation heat treatment is therefore performed because in some cases, such crystal defects cannot be sufficiently repaired with a post-implantation activation annealing process alone and are thus left remaining.

Furthermore, after ion implantation, a high-temperature activation annealing process is performed at approximately 1600° C. to 1800° C. in a lamp furnace, a high-temperature furnace, or the like. The objective of this post-implantation high-temperature activation annealing process also includes to promote recrystallization of the distorted crystal structure. Any crystal defects left remaining become sites for leakage current in the semiconductor device and can therefore potentially cause deterioration in device performance. However, this pre-implantation heat treatment and post-implantation activation annealing process must be performed as ancillary processes, which introduces a large cost in the overall semiconductor device manufacturing process.

In addition, the high temperatures of greater than or equal to 1600° C. used during activation annealing are higher than the melting point or softening point of some of the materials in the semiconductor device. Therefore, exposing the overall semiconductor device to such significantly high temperatures during activation annealing can potentially result in deterioration or degradation of these materials. Avoiding this problem requires performing the activation annealing process prior to most of the other processes, which creates significant restrictions in terms of the order in which the individual processes of the overall manufacturing process can be performed.

Further research into methods of introducing impurities other than ion implantation reveals Patent Document 2, for example, which discloses a laser doping technology in which an impurity element such as Al or B is irradiated with laser light while in contact with the surface of a semiconductor substrate in order to introduce that impurity element into the semiconductor substrate. In Patent Document 2, an Al or B impurity element layer is vapor deposited as a film onto the surface of an n-type SiC semiconductor substrate, and then this impurity element layer is irradiated with pulses of laser light in order to form p-type SiC semiconductor regions. This laser doping can be performed at low temperatures of approximately equal to room temperature and therefore eliminates the need for a high-temperature process.

However, when laser doping the surface of SiC, light energy is applied from the surface side in order to induce a reaction, thereby inevitably resulting in a state in which during doping, the reaction temperature is highest at the uppermost surface side of the SiC, while the reaction temperature becomes increasingly low at positions at greater depths from the surface. Moreover, the diffusion coefficient of the Al or B impurity element is extremely low. Therefore, when laser doping using an Al or B impurity element alone, it is difficult to form p-type impurity-doped layers at positions deep from the uppermost surface of a to-be-doped layer in the SiC.

RELATED ART DOCUMENTS

Patent Documents

Patent Document 1: Japanese Translation of PCT International Application Publication No. 2002-518828
Patent Document 2: Japanese Patent Application Laid-Open Publication No. H08-264468

SUMMARY OF THE INVENTION

The present invention was made in view of the problems described above and aims to provide a method of efficiently manufacturing a semiconductor device that has an impurity-doped layer in which p-type impurities may be introduced at high concentration down to positions deep from the surface side.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the present disclosure provides a method of manufacturing a semiconductor device, including: forming, on a surface of an n-type semiconductor layer, an impurity source film containing both aluminum and beryllium; and forming a p-type impurity-doped layer in the n-type semiconductor layer by irradiating the impurity source film with first laser light to simultaneously introduce the aluminum and the beryllium into the n-type semiconductor layer.

The method of manufacturing a semiconductor device according to the present invention makes it possible to efficiently manufacture a semiconductor device that has an impurity-doped layer in which p-type impurities are introduced at high concentration down to positions deep from the surface side.

It is to be understood that both the foregoing general description and the following detailed description are exemplary and explanatory, and are intended to provide further explanation of the invention as claimed.

DETAILED DESCRIPTION OF EMBODIMENTS

Figure 1:
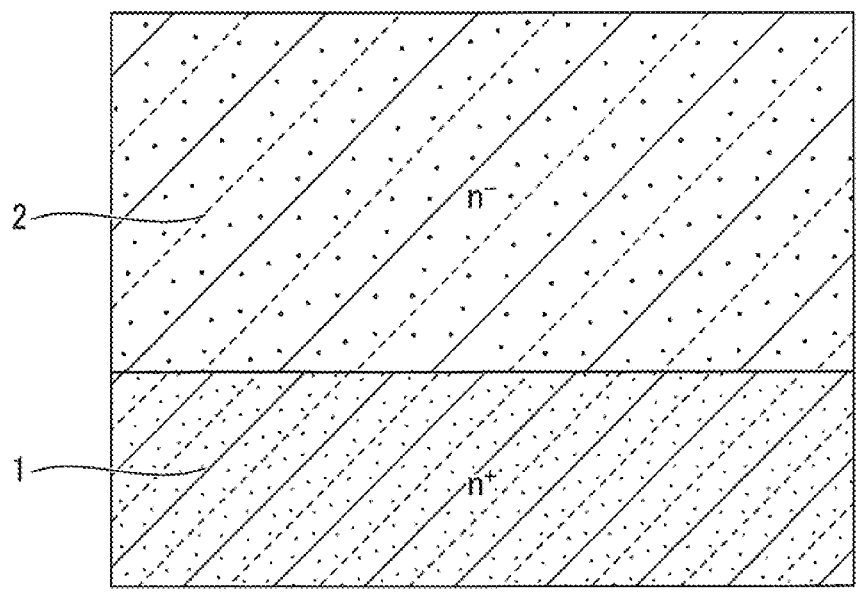
FIG. 1 is a cross-sectional view schematically illustrating a (first) step in a method of manufacturing a semiconductor device according to Embodiment 1 of the present invention.

Next, Embodiments 1 and 2 of the present invention will be described. In the following descriptions of the figures, the same or similar reference characters are used for components that are the same or similar. Note, however, that the figures are only intended to be schematic illustrations, and the relationships between thickness and planar dimensions, the proportions between the thicknesses of each device and each component, and the like may be different from in the actual devices. Therefore, specific thicknesses and dimensions should be determined by referring to the descriptions below. Similarly, the illustrated dimensional relationships and proportions of components in the figures may differ from one figure to the next.

Moreover, in the following descriptions, the "left and right" and the "up and down" directions are defined only for the purposes of convenience and do not limit the technical concepts of the present invention in any way. Therefore, the figures may be rotated by 90° such that the "left and right" and the "up and down" directions are interchanged, or the figures may be rotated by 180° such that the "left" direction becomes the "right" direction and the "right" direction becomes the "left" direction, for example. Furthermore, although the following descriptions assume that the "first conductivity type" is n-type and that the "second conductivity type" is p-type as an example, the conductivity types may be selected in the opposite manner such that the first conductivity type is p-type and the second conductivity type is n-type. In addition, the superscripted + and − symbols are appended to the letters n and p to indicate that the corresponding semiconductor region has a higher or lower impurity concentration, respectively, than a semiconductor region for which the + and − symbols are not appended to the letters n and p.

Embodiment 1

Figure 8:
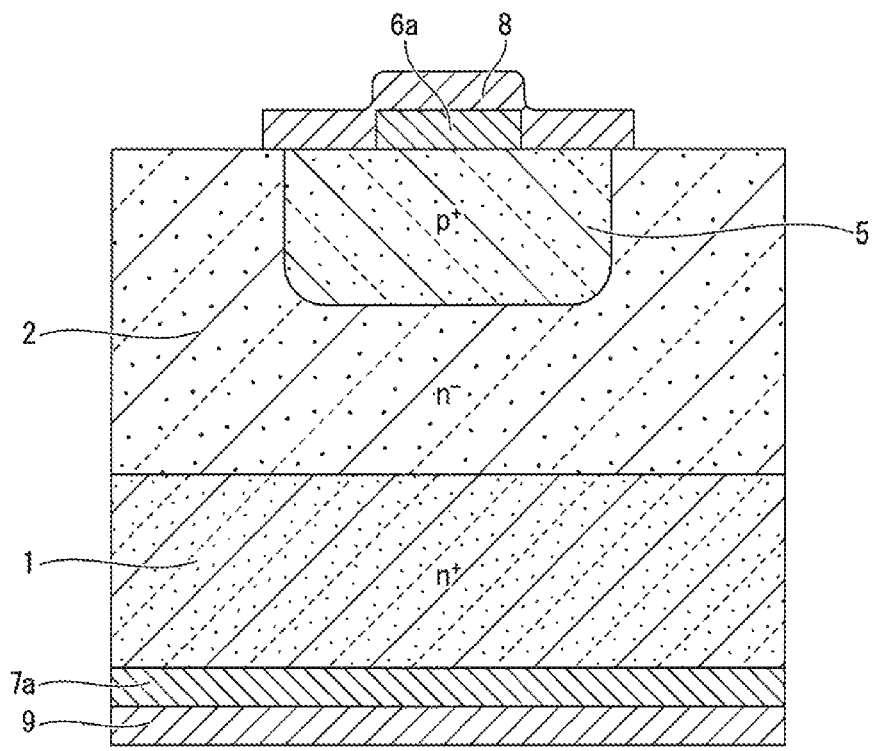
FIG. 8 is a cross-sectional view schematically illustrating a (seventh) step in the method of manufacturing a semiconductor device according to Embodiment 1.

In a method of manufacturing a semiconductor device according to Embodiment 1, a power p-n diode as illustrated in FIG. 8 is manufactured as an SiC semiconductor device. The semiconductor device illustrated in FIG. 8 includes an n-type ($n^+$) supporting layer (SiC substrate) 1 of a high impurity concentration and an n-type (n) to-be-doped layer 2 of a low impurity concentration formed on the upper surface (the silicon (Si) plane) of the supporting layer 1. A p-type ($p^+$) impurity-doped layer 5 of a high impurity concentration is formed in an upper portion of the to-be-doped layer 2.

To manufacture this semiconductor device, first, as illustrated in FIG. 1, a semiconductor substrate (1, 2) including the $n^+$ supporting layer 1 and the $n^-$ to-be-doped layer 2 is prepared. The SiC has a monocrystalline 4H crystal structure, and the overall supporting layer 1 has a thickness sufficient to serve as the lower structure of the semiconductor device to be manufactured thereon. When the semiconductor device is a power p-n diode for use in an SiC power semiconductor device, for example, the thickness of the supporting layer 1 can be approximately 350 μm. The to-be-doped layer 2 is deposited by being epitaxially grown or the like, for example, and the thickness of the to-be-doped layer 2 is determined as appropriate based on the desired breakdown voltage of the semiconductor device to be manufactured.

Figure 2:
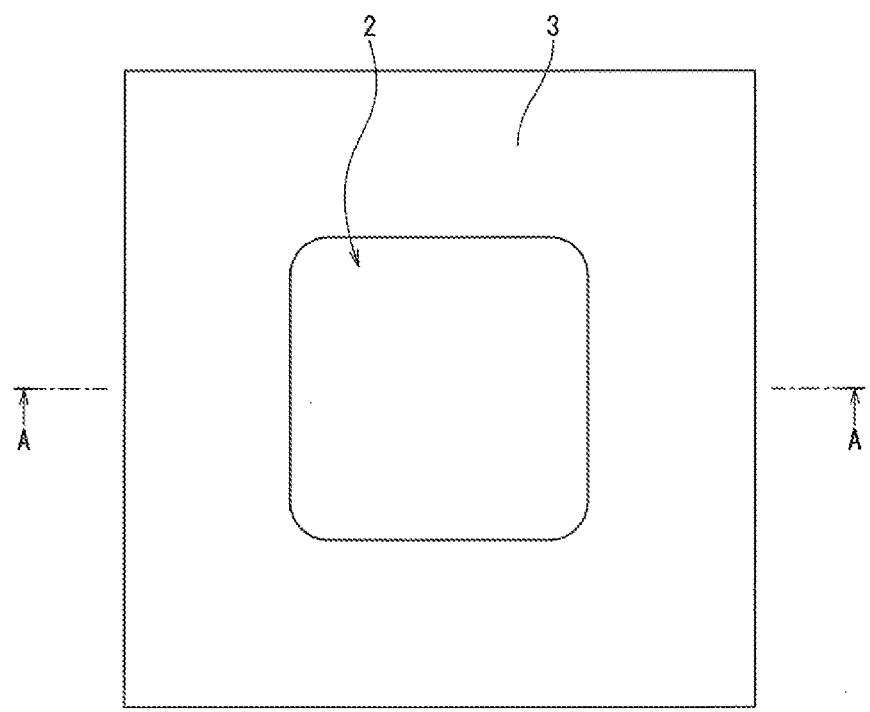
FIG. 2 is a top view schematically illustrating a (second) step in the method of manufacturing a semiconductor device according to Embodiment 1.
Figure 3:
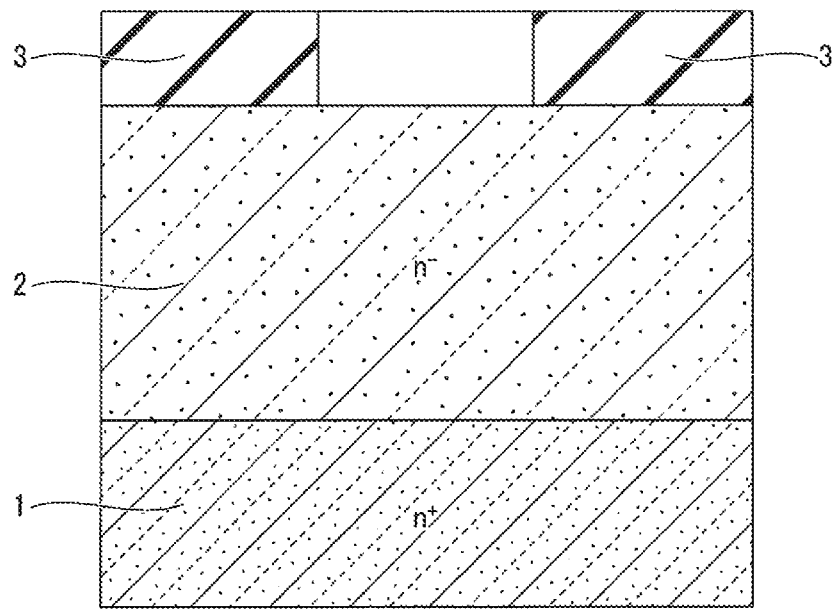
FIG. 3 is a cross-sectional view taken along the A-A direction in FIG. 2.

Next, using a thermal oxidation process or the like, a thin film of silicon dioxide ($SiO_2$) or the like is deposited to a thickness of approximately 1 μm on the upper surface of the to-be-doped layer 2. As illustrated in FIG. 2, the deposited thin film is then patterned into the desired shape using a photolithography technology, an etching technology and the like in order to form a mask 3 as a selective formation mask. FIG. 2 illustrates an example of the mask 3 in which the center portion is removed to form an opening. As illustrated in FIG. 3, the upper surface of the to-be-doped layer 2 is partially exposed within the opening in the mask 3, and the peripheral region of the to-be-doped layer 2 is covered by the remaining thin film.

Figure 4:
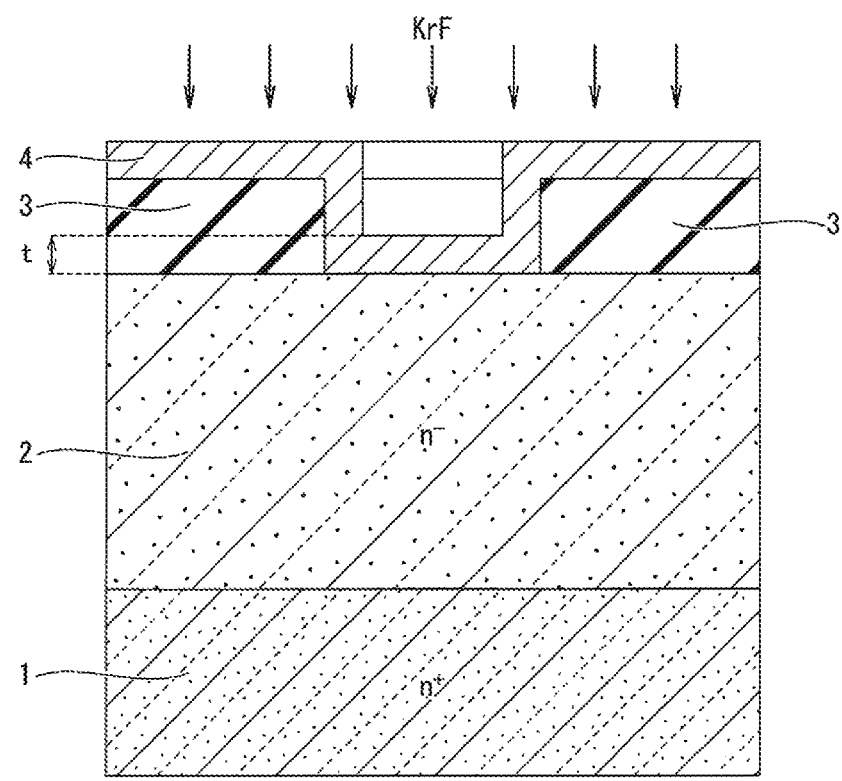
FIG. 4 is a cross-sectional view schematically illustrating a (third) step in the method of manufacturing a semiconductor device according to Embodiment 1.

Next, as illustrated in FIG. 4, using a process such as sputtering, vacuum deposition, or chemical vapor deposition (CVD), an impurity source film 4 containing both Al and Be is deposited to a constant thickness on the upper surface of the exposed to-be-doped layer 2 and the upper surface of the mask 3. The impurity source film 4 is a monolayer film containing both Al and Be as a source of impurities for the semiconductor device in the form of a compound, an alloy, a sintered mixture, or the like. It is preferable that the composition of the impurity source film 4 contain approximately 0.1 at. % to approximately 5 at. % of Be.

Moreover, the thickness t of the impurity source film 4 is set to be within the range of approximately 30 nm to approximately 1 μm. If the thickness t is less than 30 nm, the amount of impurities that can be supplied to the SiC is too low, which means an insufficient doping efficiency. If the thickness t is greater than 1 μm, the impurity source film is too thick, which increases the amount of reaction energy required, thereby resulting in a low efficiency in the production of the doped layer.

Next, the semiconductor substrate (1, 2) on which the impurity source film 4 is deposited is placed at a prescribed position in a laser irradiation device set up in an ambient air atmosphere at room temperature. Then, as illustrated in FIG. 4, the impurity source film 4 is irradiated with laser light from the upper side of the semiconductor substrate (1, 2). The laser irradiation device is not explicitly illustrated in the figure.

It is preferable that the laser light be laser light having a wavelength that provides high energy density in order to generate sufficient reaction energy between the SiC and the Al and Be. More specifically, setting the wavelength of the laser light to be greater than or equal to 190 nm makes it possible to apply light energy sufficient for the lattice vibrations of the Al and Be and the to-be-doped layer 2. Examples of lasers that can be used include excimer lasers with an oscillation wavelength such as 248 nm (KrF), 193 nm (ArF), 308 nm (XeCl), or 351 nm (XeF), for example. Alternatively, lasers of 266 nm (fourth harmonic YAG), 355 nm (third harmonic YAG), 532 nm (second harmonic YAG), 1.064 μm (YAG fundamental wavelength), or 10.6 μm (carbon dioxide ($CO_2$) gas), or the like can also be used. If the wavelength is greater than 390 nm (which corresponds to the bandgap of 4H-SiC) and there are any regions on the SiC substrate lacking Al and Be for some reason, the laser light will pass through the SiC substrate or damage the structure (such as an Al electrode) of the surface opposite to the irradiated surface. Therefore, it is more preferable that the wavelength of the laser light be not less than 190 nm and not more than 390 nm.

It is preferable that the pulse width of the laser light be set to be within the range of 50 nanoseconds (ns) to 1000 ns (1 μs) during irradiation. If the pulse width is less than 50 ns, it is not possible to achieve sufficient reaction energy. If the pulse width is greater than 1 μs, the semiconductor substrate (1, 2) experiences a greater degree of damage due to being irradiated with the laser light. Moreover, the number of laser light irradiation pulses is set to approximately one shot to several shots in consideration of the thickness of the impurity source film 4 as well as to reduce surface roughening of the SiC due to irradiation.

Figure 5:
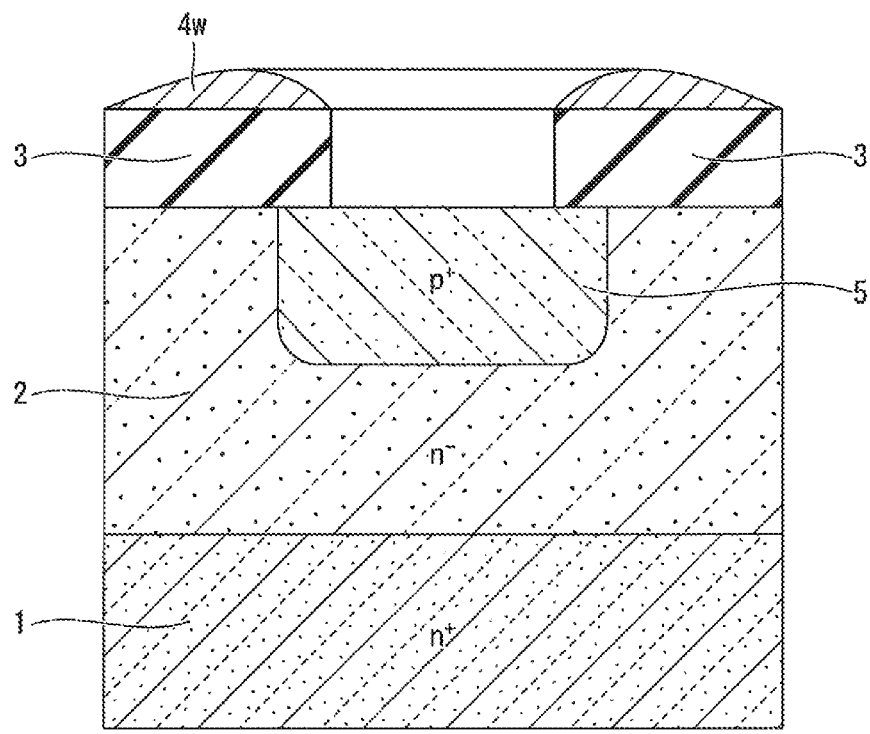
FIG. 5 is a cross-sectional view schematically illustrating a (fourth) step in the method of manufacturing a semiconductor device according to Embodiment 1.

Upon receiving energy from the laser light, the Al and Be in the impurity source film 4 are heated, undergo a temperature increase to a high temperature, and transform into a high-density plasma at substantially the same time. Then, the Al and Be get implanted, diffuse, and get activated within the crystal structure of the to-be-doped layer 2 at substantially the same time. This, as illustrated in FIG. 5, results in formation of the $p^+$ impurity-doped layer 5 in which Al and Be are both added in the front surface side of the to-be-doped layer 2. In other words, the method of manufacturing a semiconductor device according to Embodiment 1 involves laser doping the SiC using both Al and Be as the impurity source.

The impurity diffusion coefficient of Be in SiC is two to three orders of magnitude greater than that of Al. Therefore, as illustrated in FIG. 5, the process of laser doping a semiconductor device according to Embodiment 1 using the impurity source film 4 constituted by an Al and Be compound or the like results in the outer edge of the impurity-doped layer 5 extending outwards beyond the inner edge of the opening in the mask 3. Moreover, the reaction between the SiC and the Al and Be leaves a residue 4w adhered to the surface of the mask 3. This residue 4w is removed by performing a plasma treatment or the like at a reduced etching rate.

Figure 6:
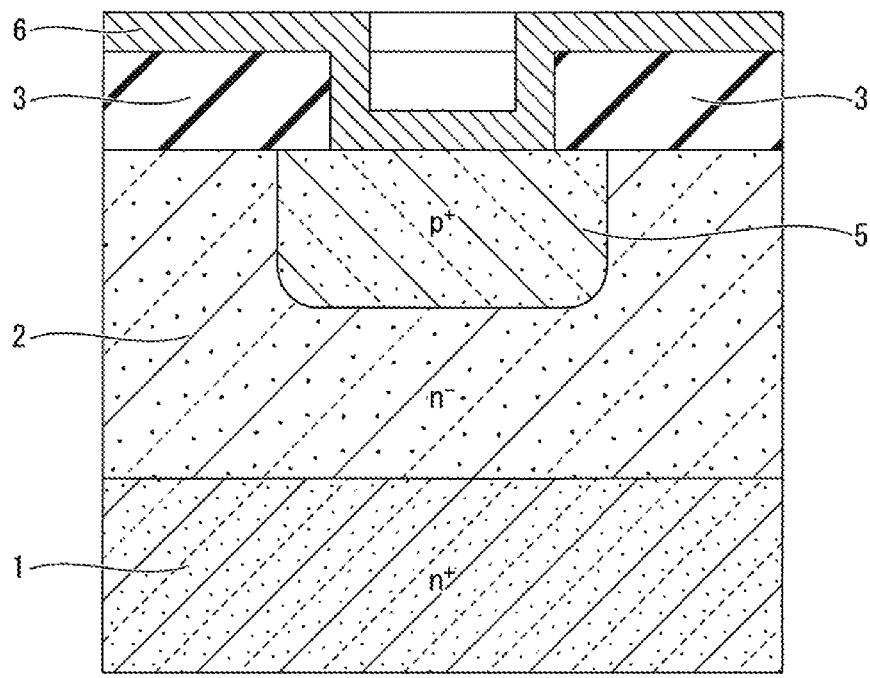
FIG. 6 is a cross-sectional view schematically illustrating a (fifth) step in the method of manufacturing a semiconductor device according to Embodiment 1.

Next, as illustrated in FIG. 6, using a sputtering process or the like, a first metal film 6 containing titanium (Ti) and Al, for example, is deposited on the upper surface of the impurity-doped layer 5 and the upper surface of the mask 3. Then, using a photolithography technology and an etching technology or the like, the deposited first metal film 6 is patterned into a desired shape to form a contact electrode which is connected to the $p^+$ impurity-doped layer 5. While etching the first metal film 6, the mask 3 is removed at the same time.

Figure 7:
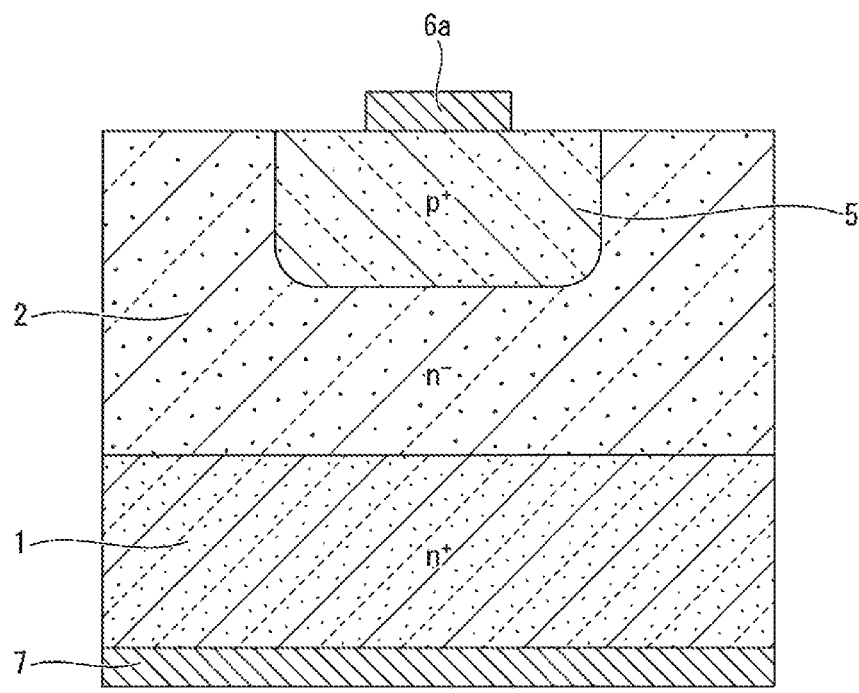
FIG. 7 is a cross-sectional view schematically illustrating a (sixth) step in the method of manufacturing a semiconductor device according to Embodiment 1.

Next, as illustrated in FIG. 7, the semiconductor substrate (1, 2) having this patterned first metal film 6 is vacuum-annealed at approximately 1000° C. for approximately 5 minutes to form a first ohmic contact electrode 6a on the upper surface of the impurity-doped layer 5. Meanwhile, using a sputtering process or the like, a second metal film 7 containing nickel (Ni) or the like is formed on the bottom surface (the carbon (C) plane) of the supporting layer 1. Then, as illustrated in FIG. 8, the semiconductor substrate (1, 2) is vacuum-annealed at approximately 1000° C. for approximately 5 minutes to form, on the bottom surface of the $n^+$ supporting layer 1, a second ohmic contact electrode 7a which is connected to that supporting layer 1.

Next, a metal film such as an Al thin film is formed on the first ohmic contact electrode 6a on the upper surface of the to-be-doped layer 2. Then, using a photolithography technology and an etching technology or the like, the formed metal film is patterned into a desired shape to form an anode electrode 8. Meanwhile, a metal film containing Ni, gold (Au) and the like is formed as a cathode electrode 9 on the bottom surface of the second ohmic contact electrode 7a on the bottom of the supporting layer 1. Then, prescribed processes such as formation of an electrode pad and formation of a passivation film are performed on the upper surface of the semiconductor substrate (1, 2). Note that the electrode pad, the passivation film, and the like are not explicitly illustrated in the figures. The sequence of processes described above makes it possible to efficiently manufacture a power p-n diode having an impurity-doped layer in which p-type impurities are introduced at high concentration down to positions deep from the surface side.

Figure 9:
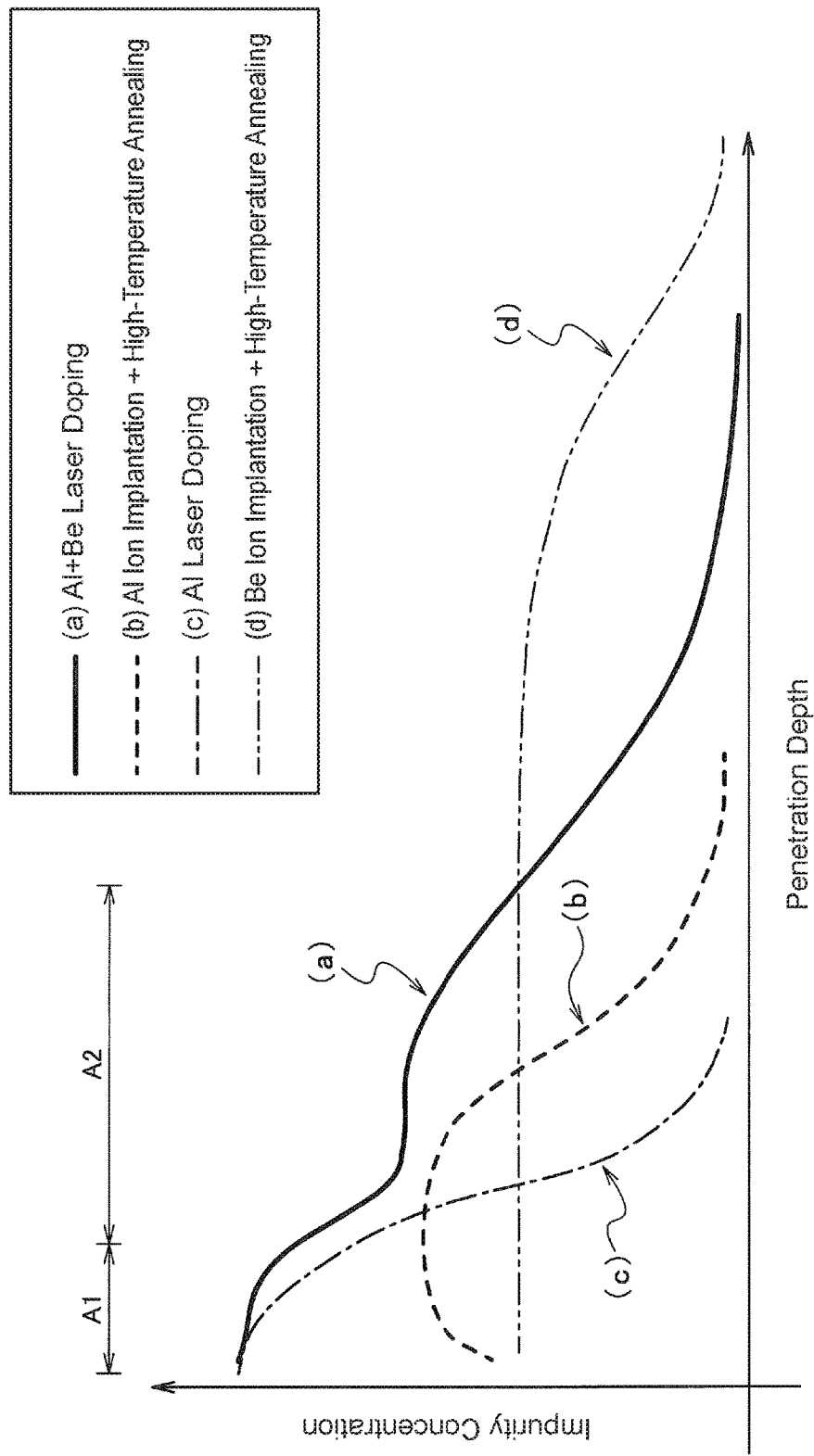
FIG. 9 is a graph showing the relationship between the depth and concentration of introduced p-type impurities in a semiconductor device manufactured using the method of manufacturing a semiconductor device according to Embodiment 1 as well as the relationship in Comparison Examples 1 to 3.

In order to examine the state of introduction of p-type impurities in the method of manufacturing a semiconductor device according to Embodiment 1, semiconductor devices were manufactured according to Comparison Examples 1 to 3. In FIG. 9, line (a) shows the p-type impurity introduction profile achieved with the method of manufacturing a semiconductor device according to Embodiment 1. In the example corresponding to line (a), the impurity source film 4 contained approximately 2.5 at. % of Be. A KrF laser light source with a wavelength of 248 nm was used as the source of laser light. The impurity source film 4 on the to-be-doped layer 2 was irradiated with one shot of this laser light at an energy density of approximately 4.0 J/cm$^2$ and a pulse width of approximately 100 ns.

Moreover, line (b) in FIG. 9 shows the Al introduction profile obtained upon manufacturing a semiconductor device according to Comparison Example 1 using an Al ion implantation process and a high-temperature activation annealing process. In Comparison Example 1, Al was ion-implanted in a low-concentration $n^-$ to-be-doped layer identical to the to-be-doped layer 2 used in the method of manufacturing a semiconductor device according to Embodiment 1.

Furthermore, line (c) in FIG. 9 shows the Al introduction profile obtained upon manufacturing a semiconductor device according to Comparison Example 2 by laser doping with a thin film containing only Al and no Be. In Comparison Example 2, an Al thin film deposited on a low-concentration n to-be-doped layer identical to the to-be-doped layer 2 used in the method of manufacturing a semiconductor device according to Embodiment 1 was irradiated with laser light under the same irradiation conditions as in the example corresponding to line (a).

In addition, line (d) in FIG. 9 shows the Be introduction profile obtained upon manufacturing a semiconductor device according to Comparison Example 3 using a Be ion implantation process and a high-temperature activation annealing process. In Comparison Example 3, Be was ion-implanted in a low-concentration n to-be-doped layer identical to the to-be-doped layer 2 used in the method of manufacturing a semiconductor device according to Embodiment 1.

As shown by line (a) in FIG. 9, when using the method of manufacturing a semiconductor device according to Embodiment 1, a higher concentration of p-type impurities was introduced into a region A1 on the surface side of the SiC than when using the Al ion implantation process in Comparison Example 1 shown by line (b). Moreover, when using the method of manufacturing a semiconductor device according to Embodiment 1, the p-type impurities were introduced into the region A1 at a high concentration which was approximately equal to or greater than that achieved when laser doping with a thin film of only Al in Comparison Example 2 shown by line (c).

Meanwhile, the concentration of p-type impurities introduced into a region A2 positioned deeper than the region A1 on the surface side of the SiC was also higher when using the method of manufacturing a semiconductor device according to Embodiment 1 than when laser doping with a thin film of only Al as shown by line (c). Similarly, when using the method of manufacturing a semiconductor device according to Embodiment 1, a higher concentration of p-type impurities was introduced into the region A2 than when using the Be ion implantation process in Comparison Example 3 shown by line (d).

As shown in FIG. 9, the method of manufacturing a semiconductor device according to Embodiment 1 (in which Al and Be are both diffused at the same time and activated at the same time) makes it possible to achieve, on the surface side of the SiC, an impurity concentration in the p-type impurity-doped layer 5 that is comparable to or higher than when laser doping using only Al. At positions deeper than the surface side, this method also makes it possible to achieve impurity-doped layer 5 concentrations far higher than any of the concentrations obtained by the Al-only laser doping, the Al ion implantation, and the Be ion implantation. Moreover, this method does not require a pre-implantation heat treatment or a post-implantation high-temperature heat treatment of the type associated with conventional ion implantation processes and makes it possible to form the high-concentration p-type impurity-doped layer 5 using a low-temperature process at room temperature level, thereby reducing the restrictions on and improving the freedom of the overall manufacturing process. Therefore, the method of manufacturing a semiconductor device according to Embodiment 1 makes it possible to, using a laser doping technology, efficiently manufacture a semiconductor device having the impurity-doped layer 5 in which p-type impurities are introduced at high concentration down to positions deep from the surface side.

Figure 10:
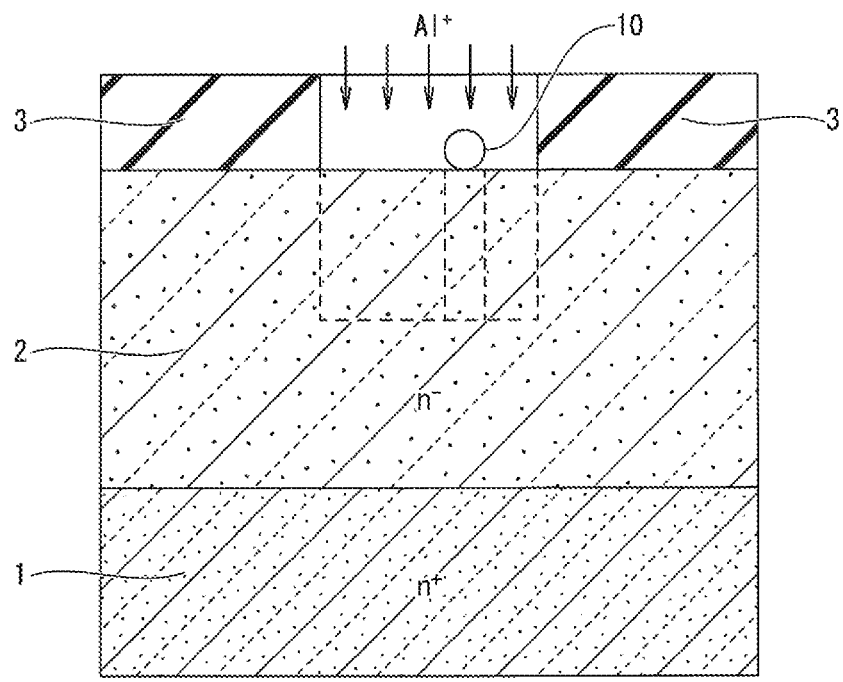
FIG. 10 is a cross-sectional view schematically illustrating a (first) step in a method of manufacturing a semiconductor device according to Comparison Example 1.
Figure 11:
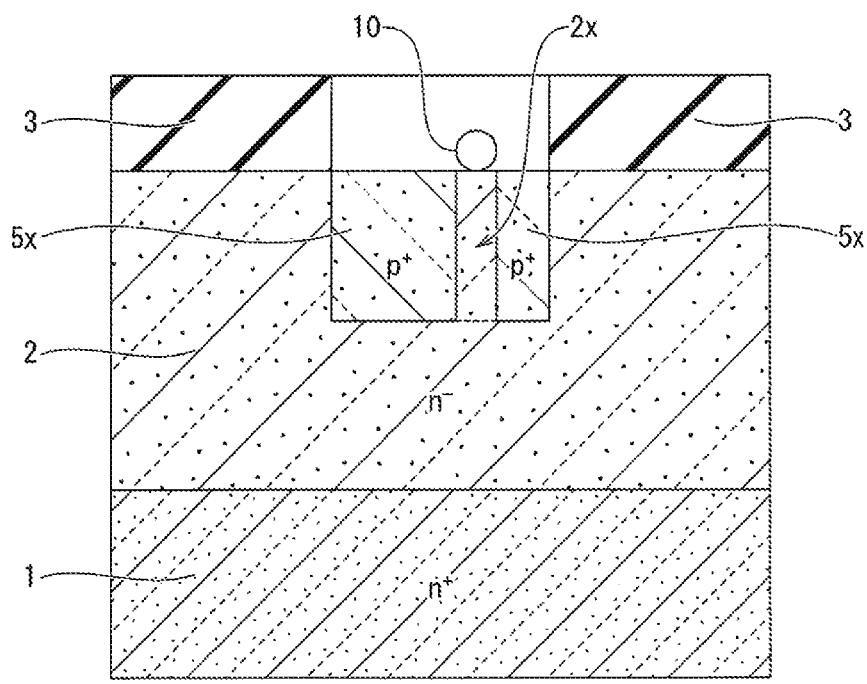
FIG. 11 is a cross-sectional view schematically illustrating a (second) step in the method of manufacturing a semiconductor device according to Comparison Example 1.

Furthermore, as illustrated in FIG. 10, when introducing impurities using ion implantation and high-temperature annealing as in Comparison Example 1, during the ion implantation process there are sometimes foreign materials 10 (such as particles) which impede implantation on the surface of the to-be-doped layer 2. When such foreign materials 10 are present, even if impurity ions such as Al are implanted, these impurity ions do not get implanted in the regions of the to-be-doped layer 2 directly beneath the foreign materials 10. Moreover, as illustrated in FIG. 11, the impurities do not diffuse into the regions of the to-be-doped layer 2 directly beneath the foreign materials 10 even after activation annealing. As a result, a defect region 2x in which no impurity layer is formed gets formed within the impurity-doped layer 5x into which Al was introduced. In the method of manufacturing a semiconductor device according to Embodiment 1, the impurity source film 4 is formed in close contact with the front surface of the to-be-doped layer 2, thereby making it possible to avoid formation of defect regions 2x associated with ion implantation and caused by the effects of foreign materials 10.

In addition, the impurity diffusion coefficients of Al and B, which are p-type impurities, are extremely small in SiC, and therefore even after performing a high-temperature activation annealing process at greater than 1600° C. following ion implantation, the impurities exhibit substantially no diffusion in the depth direction and the horizontal direction. For example, the shape of the implantation region shown by the dashed line in the to-be-doped layer 2 in FIG. 10 and the shape of the impurity-doped layer 5x in FIG. 11 have substantially the same depth and width. In other words, the concentration profile of the impurity-doped layer 5x undergoes substantially no changes relative to the concentration profile achieved during ion implantation.

Figure 12:
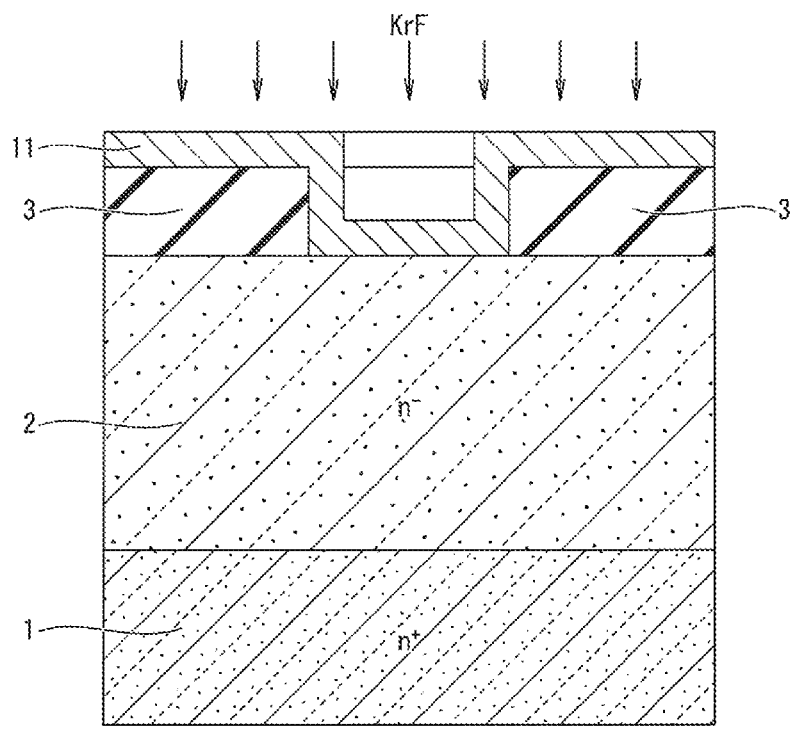
FIG. 12 is a cross-sectional view schematically illustrating a (first) step in a method of manufacturing a semiconductor device according to Comparison Example 2.
Figure 13:
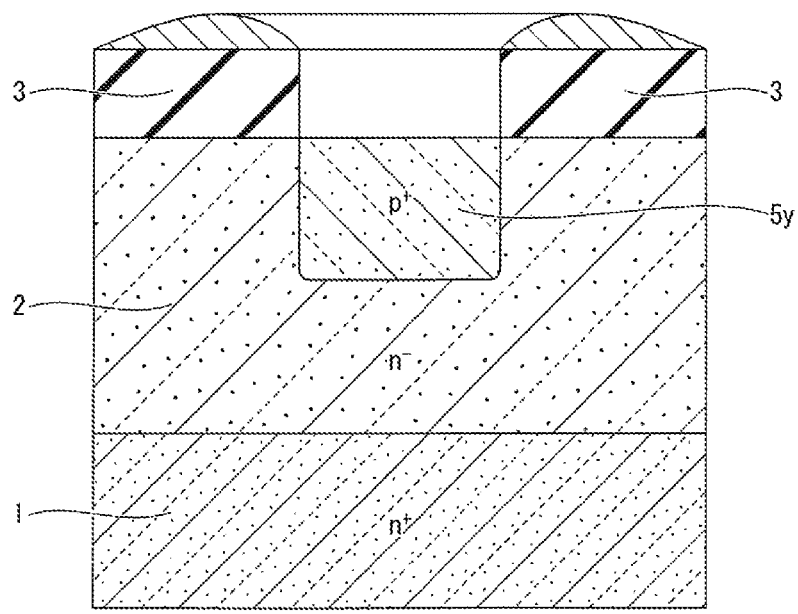
FIG. 13 is a cross-sectional view schematically illustrating a (second) step in the method of manufacturing a semiconductor device according to Comparison Example 2.

Moreover, as illustrated in FIG. 12, when laser doping using only Al as in Comparison Example 2, an Al thin film 11 is deposited on the to-be-doped layer 2 with the mask 3 interposed therebetween, and then the assembly is irradiated with laser light from the upper side of the Al thin film 11. As a result, as illustrated in FIG. 13, an impurity-doped layer 5y in which Al is introduced is formed in the upper portion of the to-be-doped layer 2. However, similar to in Comparison Example 1, the Al impurities exhibit substantially no diffusion in the depth direction and the horizontal direction. In particular, comparing the width of the opening in the mask 3 and the width in the left-to-right direction of the impurity-doped layer 5y in FIG. 13 makes it clear that the planar shape of the impurity-doped layer 5y and the opening shape in the mask 3 are substantially the same.

Therefore, Comparison Example 1 and Comparison Example 2 require extremely high precision in mask pattern alignment because if the actual mask pattern gets offset even slightly from the designed position, it is no longer possible to form the impurity-doped layer at the desired position. Moreover, there are also cases in which in order to ensure that an impurity-doped layer with the necessary width is formed even if such a positional offset occurs, the size of the region allocated for introduction of impurities is intentionally increased by intentionally setting the width of the opening in the mask 3 to be greater than the planned width of the impurity-doped layer. This addition of extra width beyond the planned width of the impurity-doped layer to the width of the opening results in a decrease in manufacturing efficiency.

In the method of manufacturing a semiconductor device according to Embodiment 1, the laser doping is performed using a combination of both Al and Be (which have a high diffusion coefficient) instead of using only Al. This reduces the burdens associated with high-precision alignment and eliminates the need to add extra width to the opening in the mask 3.

MODIFICATION EXAMPLE 1

Figure 14:
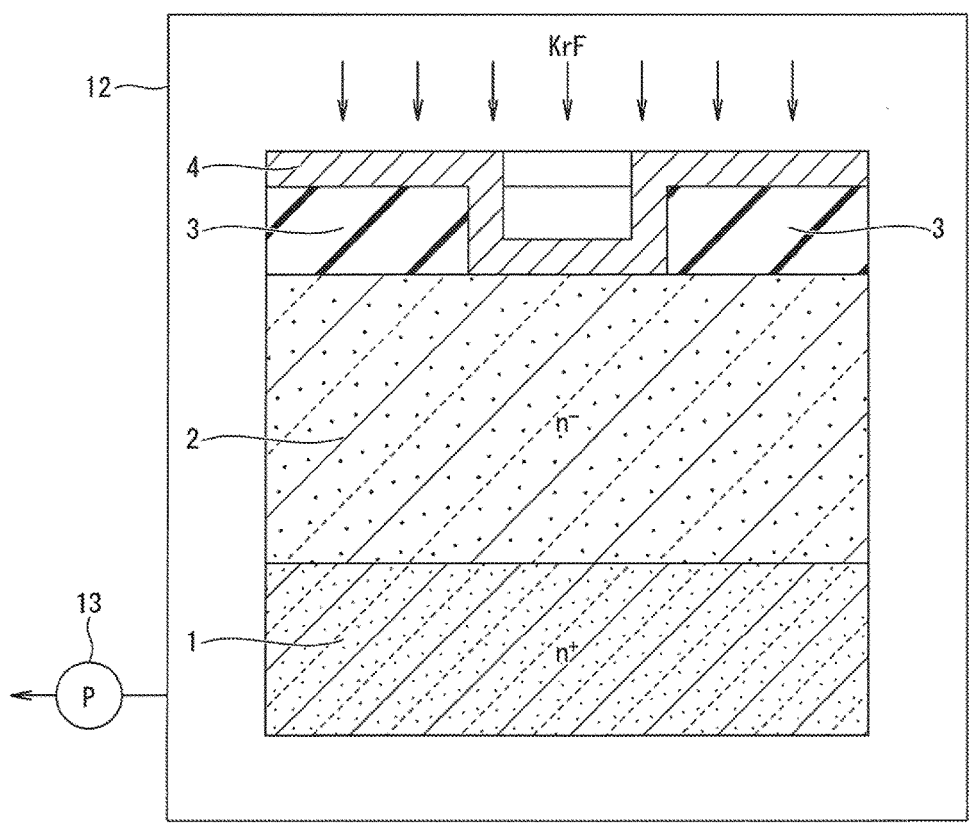
FIG. 14 is a cross-sectional view schematically illustrating a step in Modification Example 1 of the method of manufacturing a semiconductor device according to Embodiment 1.

As illustrated in FIG. 14, the method of manufacturing a semiconductor device according to Embodiment 1 can be performed by placing the semiconductor substrate (1, 2) inside an airtight chamber 12 and then using a pump 13 or the like to create a vacuum in the chamber 12. Alternatively, the interior of the chamber 12 may be filled with an inert gas atmosphere. The other steps in the method of manufacturing a semiconductor device according to Modification Example 1 are the same as the respective steps described with reference to FIGS. 1 to 8 and therefore will not be described again here.

In the method of manufacturing a semiconductor device according to Modification Example 1, performing the laser light irradiation process under vacuum or in an inert gas atmosphere makes it possible to reduce the introduction of oxygen into the surface of the semiconductor substrate (1, 2) caused by heat generated during irradiation with laser light. Therefore, in addition to it being possible to efficiently manufacture a semiconductor device having an impurity-doped layer in which p-type impurities are introduced at high concentration down to positions deep from the surface side, it is also possible to further reduce crystal defects and contact resistance.

MODIFICATION EXAMPLE 2

Figure 15:
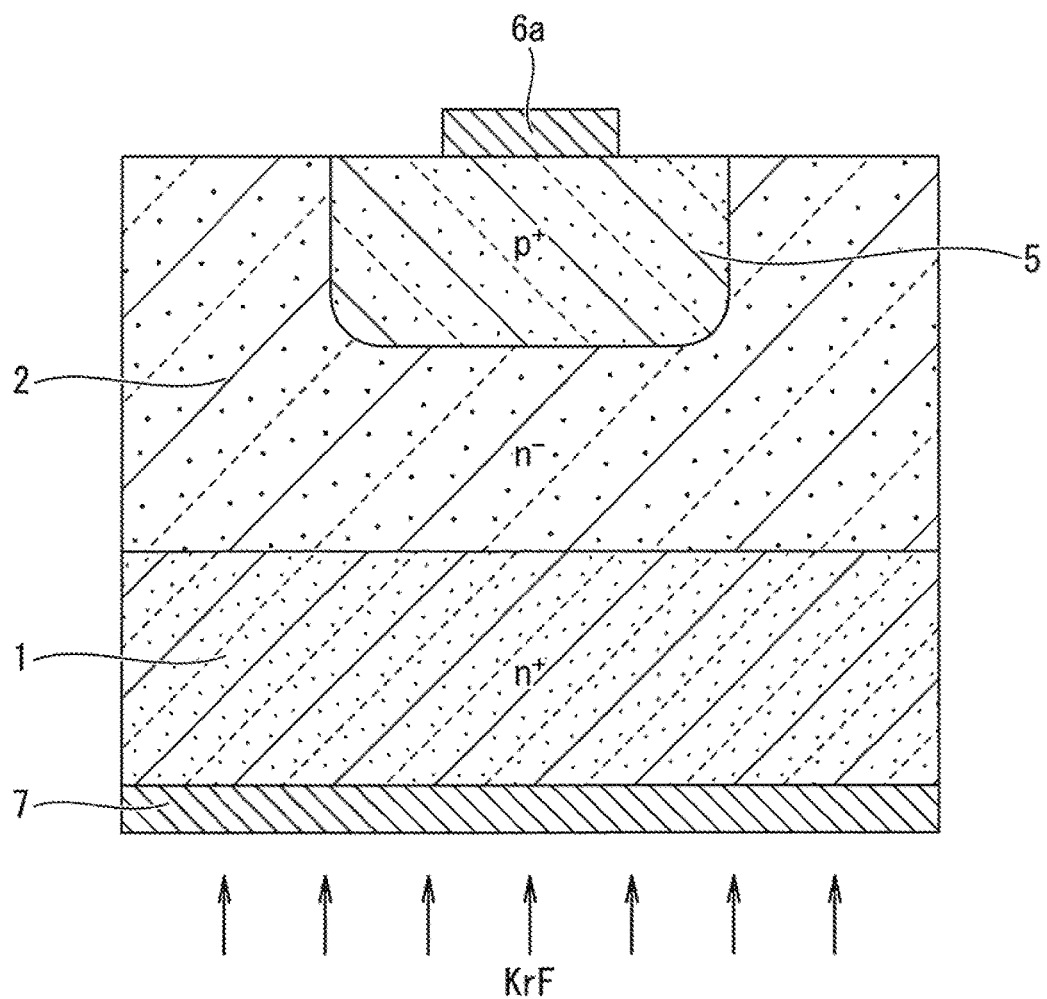
FIG. 15 is a cross-sectional view schematically illustrating a (first) step in Modification Example 2 of the method of manufacturing a semiconductor device according to Embodiment 1.
Figure 16:
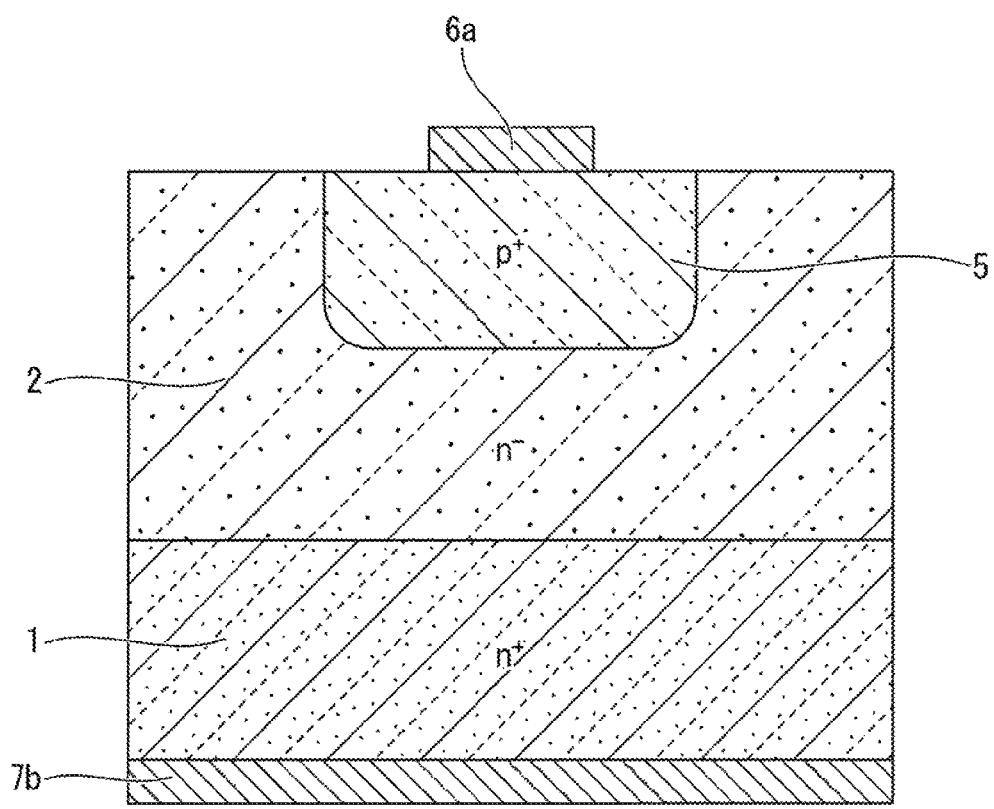
FIG. 16 is a cross-sectional view schematically illustrating a (second) step in Modification Example 2 of the method of manufacturing a semiconductor device according to Embodiment 1.

Moreover, as illustrated in FIG. 15, after forming the second metal film 7 made of Ni or the like on the bottom surface of the semiconductor substrate (1, 2), the contact electrode connected to the $n^+$ supporting layer 1 may be formed by irradiating the second metal film 7 with high-energy laser light instead of by vacuum-annealing at approximately 1000° C. As illustrated in FIG. 16, irradiating the second metal film 7 with laser light promotes silicidation, which makes it possible to form an Ni silicide ohmic contact electrode 7b. The steps other than forming the ohmic contact electrode on the bottom surface side are the same as the respective steps described with reference to FIGS. 1 to 8 and therefore will not be described again here.

In the method of manufacturing a semiconductor device according to Modification Example 2, instead of performing a high-temperature vacuum-annealing process at approximately 1000° C., a laser light irradiation process is performed to promote silicidation of the contact electrode. Therefore, in addition to it being possible to efficiently manufacture a semiconductor device having the impurity-doped layer 5 in which p-type impurities are introduced at high concentration down to positions deep from the surface side, it is also possible to further reduce process temperatures during the semiconductor device manufacturing processes.

MODIFICATION EXAMPLE 3

Figure 17:
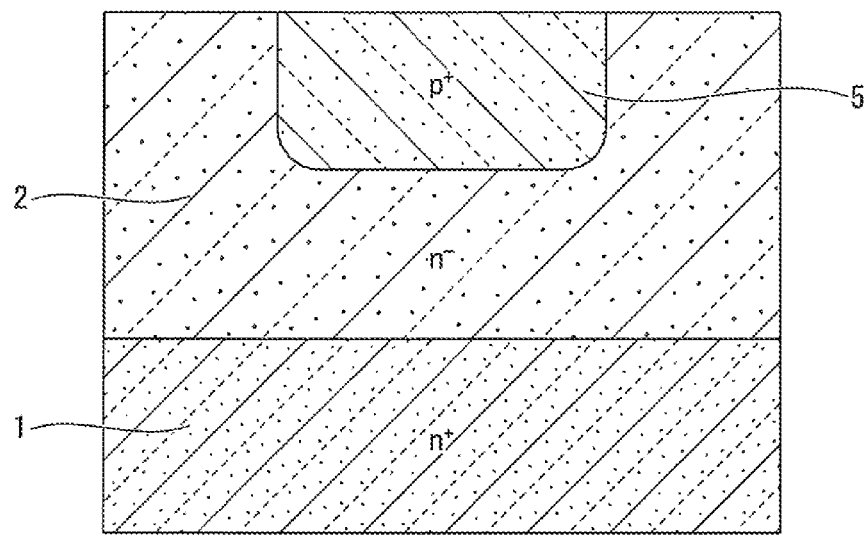
FIG. 17 is a cross-sectional view schematically illustrating a (first) step in Modification Example 3 of the method of manufacturing a semiconductor device according to Embodiment 1.

Furthermore, as illustrated in FIG. 6, in the method of manufacturing a semiconductor device according to Embodiment 1, the mask 3 which is the selective formation mask for the impurity-doped layer 5 continues to be used after formation of the impurity-doped layer 5 as the mask for forming the first ohmic contact electrode 6a. However, as illustrated in FIG. 17, after the impurity-doped layer 5 is formed, the selective formation mask may be temporarily removed from the upper surface of the impurity-doped layer 5. Then, an $SiO_2$ film or the like can be deposited again on the upper surface of the semiconductor substrate (1, 2) as a mask for forming the contact electrode.

Figure 18:
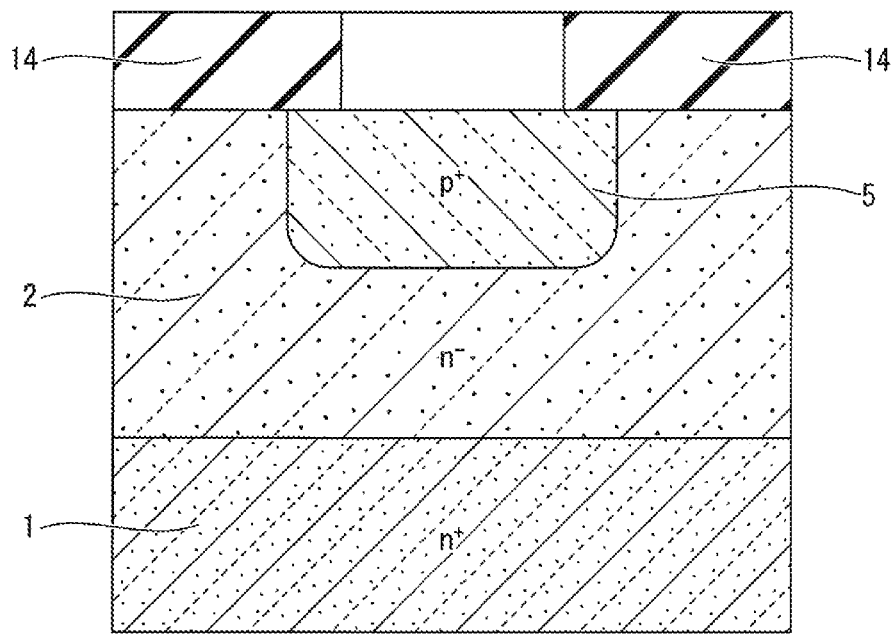
FIG. 18 is a cross-sectional view schematically illustrating a (second) step in Modification Example 3 of the method of manufacturing a semiconductor device according to Embodiment 1.

Next, as illustrated in FIG. 18, the deposited $SiO_2$ film is patterned into the desired shape using a photolithography technology, an etching technology, and the like in order to form a mask 14 for forming the first ohmic contact electrode. For the remaining steps, the same steps as the respective steps described with reference to FIGS. 6 to 8 can be performed, except in that here, the portion described as being the mask 3 in FIG. 6 is replaced with the mask 14.

In the method of manufacturing a semiconductor device according to Modification Example 3, the selective formation mask for forming the impurity-doped layer 5 pattern is removed, and then the first ohmic contact electrode connected to the $p^+$ impurity-doped layer 5 is formed using the newly formed mask 14. Therefore, in addition to it being possible to efficiently manufacture a semiconductor device having the impurity-doped layer 5 in which p-type impurities are introduced at high concentration down to positions deep from the surface side, it is also possible to, if any slight residue is left adhering to the selective formation mask, reliably prevent that residue from getting incorporated into the semiconductor device and causing issues.

MODIFICATION EXAMPLE 4

Figure 19:
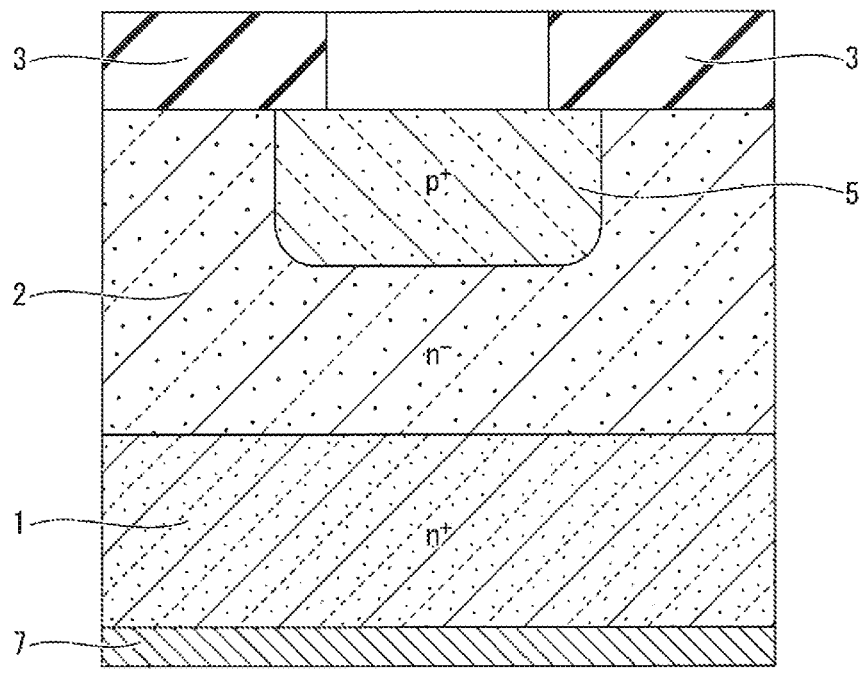
FIG. 19 is a cross-sectional view schematically illustrating a (first) step in Modification Example 4 of the method of manufacturing a semiconductor device according to Embodiment 1.

In a method of manufacturing a semiconductor device according to Modification Example 4, first, the respective steps described with reference to FIGS. 1 to 5 are performed, and the overall process is the same up through the step of removing the residue 4w with a plasma treatment or the like after forming the impurity-doped layer 5 in the to-be-doped layer 2. Then, as illustrated in FIG. 19, instead of forming the first metal film on the upper surface of the mask 3 on the to-be-doped layer 2, the second metal film 7 containing Ni or the like is formed on the bottom surface of the supporting layer 1.

Figure 20:
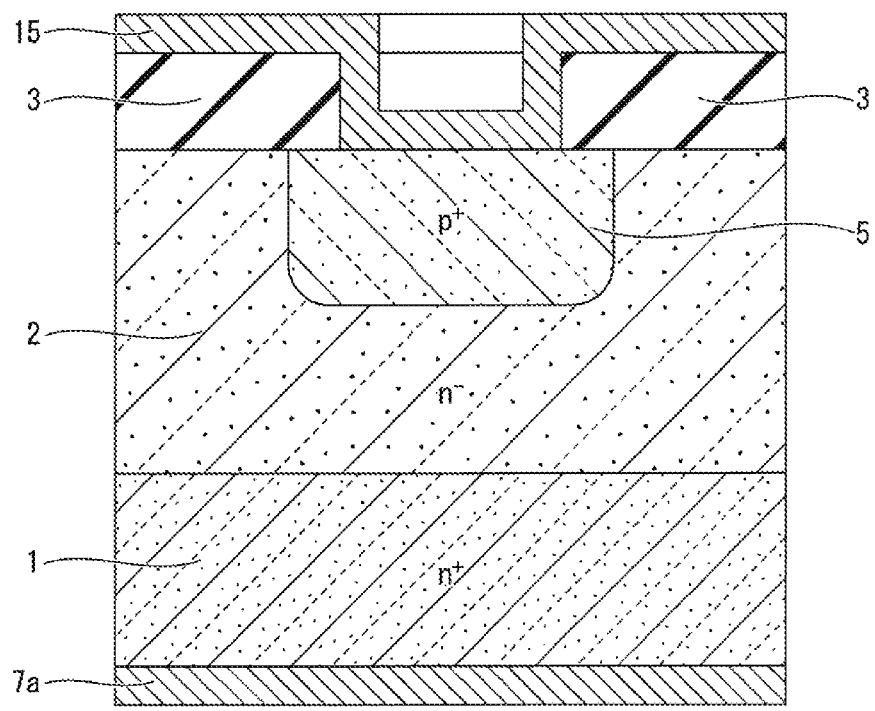
FIG. 20 is a cross-sectional view schematically illustrating a (second) step in Modification Example 4 of the method of manufacturing a semiconductor device according to Embodiment 1.

Next, as illustrated in FIG. 20, the semiconductor substrate (1, 2) is vacuum-annealed at approximately 1000° C. for approximately 5 minutes to form, on the bottom surface of the $n^+$ supporting layer 1, the second ohmic contact electrode 7a which is connected to that supporting layer 1. Then, a third metal film 15 which is a Ti thin film or the like is deposited on the upper surface of the impurity-doped layer 5 and the upper surface of the mask 3. Next, using a photolithography technology, an etching technology, and the like, the deposited third metal film 15 is patterned into a desired shape to form a contact electrode.

Figure 21:
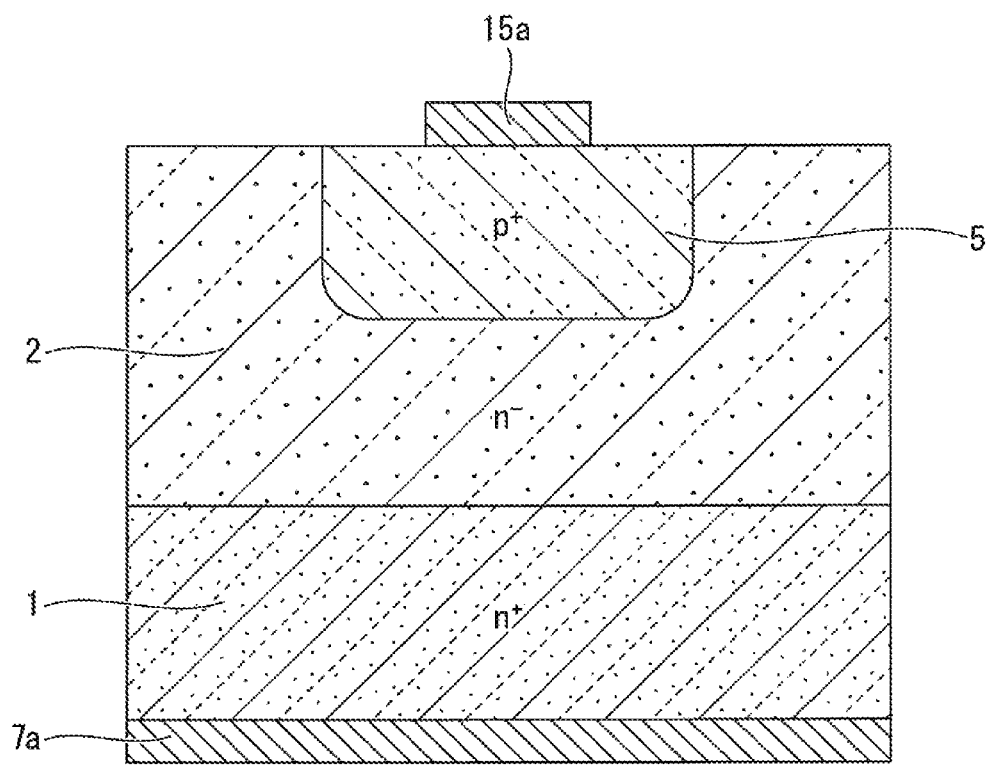
FIG. 21 is a cross-sectional view schematically illustrating a (third) step in Modification Example 4 of the method of manufacturing a semiconductor device according to Embodiment 1.

Then, as illustrated in FIG. 21, the semiconductor substrate (1, 2) having this patterned third metal film 15 is heated by being vacuum-annealed at approximately 500° C. for approximately 10 minutes in order to form, on the upper surface of the impurity-doped layer 5, a Schottky contact electrode 15a which is connected to that impurity-doped layer 5. For the remaining steps, the same processes as in the respective steps described with reference to FIG. 8 can be performed, except in that here, the portion described as being the first ohmic contact electrode 6a is replaced with the Schottky contact electrode 15a.

The method of manufacturing a semiconductor device according to Modification Example 4 makes it possible to efficiently manufacture a Schottky barrier diode having the impurity-doped layer 5 in which p-type impurities are introduced at high concentration down to positions deep from the surface side and also having a contact electrode forming a Schottky contact with the impurity-doped layer 5.

MODIFICATION EXAMPLE 5

Figure 22:
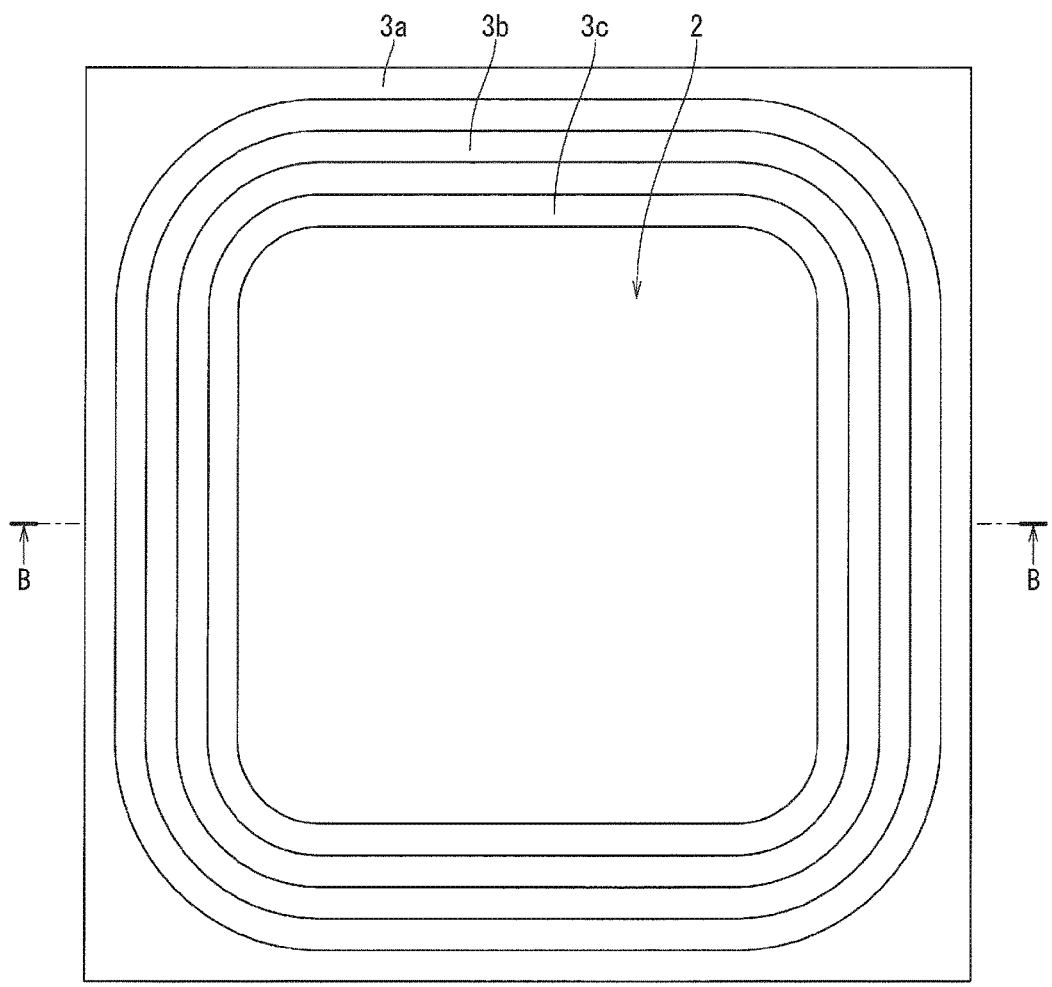
FIG. 22 is a top view schematically illustrating a (first) step in Modification Example 5 of the method of manufacturing a semiconductor device according to Embodiment 1.

In a method of manufacturing a semiconductor device according to Modification Example 5, first, as illustrated in FIG. 1, the semiconductor substrate (1, 2) is prepared, and an $SiO_2$ thin film or the like is deposited on the upper surface of the semiconductor substrate (1, 2) as a mask. Then, as illustrated in FIG. 22, the deposited $SiO_2$ thin film or the like is patterned to form a first ring-shaped mask 3a, a second ring-shaped mask 3b, and a third ring-shaped mask 3c as selective formation masks.

Figure 23:
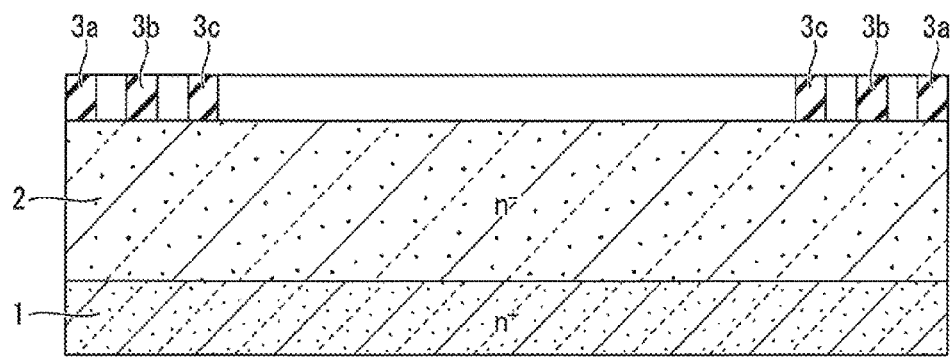
FIG. 23 is a cross-sectional view taken along the B-B direction in FIG. 22.

The first ring-shaped mask 3a, second ring-shaped mask 3b, and third ring-shaped mask 3c each have a ring-shaped or frame-shaped planar pattern of substantially the same width and are arranged at substantially equidistant intervals. As illustrated in FIG. 23, the gap between the first ring-shaped mask 3a and the second ring-shaped mask 3b is positioned on the outermost peripheral side of the semiconductor substrate (1, 2). The gap between the second ring-shaped mask 3b and the third ring-shaped mask 3c is positioned on the inner side of the outermost peripheral side of the semiconductor substrate (1, 2). The interior side of the third ring-shaped mask 3c forms a larger opening in the center of the semiconductor substrate (1, 2). The upper surface of the to-be-doped layer 2 is respectively exposed in the gap on the outermost peripheral side, in the gap on the inner side of the outermost peripheral side, and in the opening in the center.

Figure 24:
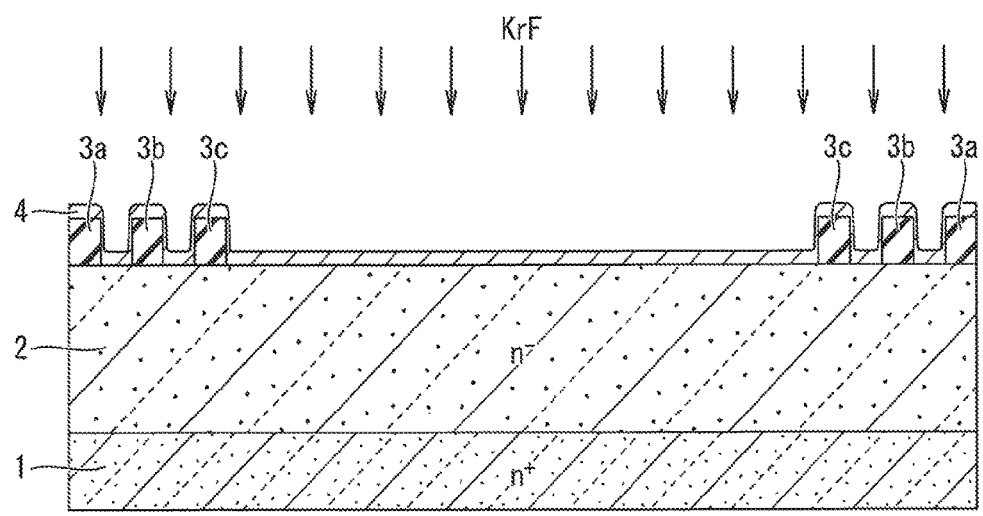
FIG. 24 is a cross-sectional view schematically illustrating a (second) step in the method of manufacturing a semiconductor device according to Modification Example 5 of the method of manufacturing a semiconductor device according to Embodiment 1.

Next, as illustrated in FIG. 24, an impurity source film 4 is deposited spanning across the upper surface of the to-be-doped layer 2 and across the respective upper surfaces of the first ring-shaped mask 3a, second ring-shaped mask 3b, and third ring-shaped mask 3c. Then, the impurity source film 4 is irradiated with laser light from the upper side thereof to introduce both Al and Be into the to-be-doped layer 2 at the same time.

Figure 25:
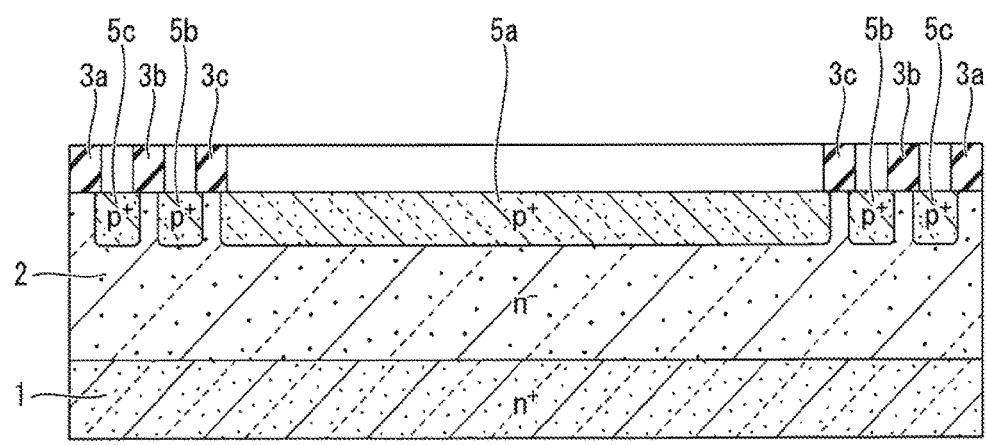
FIG. 25 is a cross-sectional view schematically illustrating a (third) step in Modification Example 5 of the method of manufacturing a semiconductor device according to Embodiment 1.

FIG. 25 illustrates a resulting center $p^+$ impurity-doped layer 5a formed in the upper portion of the center of the to-be-doped layer 2 on the inner side of the third ring-shaped mask 3c as the active portion of the semiconductor device. Moreover, a first ring-shaped $p^+$ impurity-doped layer 5b is formed in the upper portion of the to-be-doped layer 2 between the second ring-shaped mask 3b and the third ring-shaped mask 3c on the outer side of the center impurity-doped layer 5a. Similarly, a second ring-shaped $p^+$ impurity-doped layer 5c is formed in the upper portion of the to-be-doped layer 2 between the first ring-shaped mask 3a and the second ring-shaped mask 3b on the outer side of the first ring-shaped impurity-doped layer 5b.

The first ring-shaped impurity-doped layer 5b and the second ring-shaped impurity-doped layer 5c function as field limiting ring (FLR) structures in the peripheral region of the semiconductor device. The method of manufacturing a semiconductor device according to Modification Example 5 makes it possible to efficiently manufacture the p-type impurity-doped layer 5 and the FLR structures (which are effective in improving breakdown voltage) at the same time by introducing p-type impurities at high concentrations down to positions deep from the surface side in both the p-type impurity-doped layer 5 and the FLR structures.

MODIFICATION EXAMPLE 6

Figure 26:
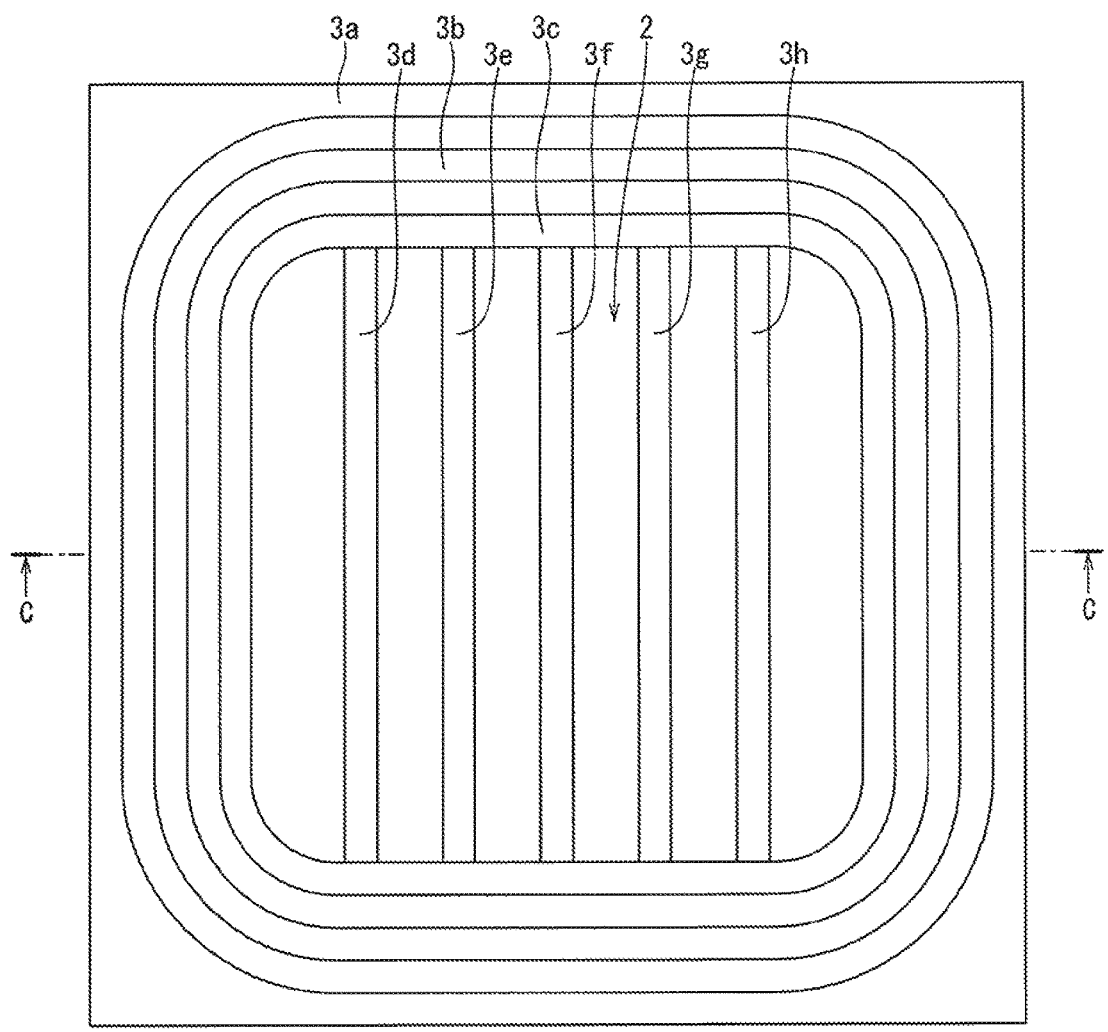
FIG. 26 is a top view schematically illustrating a (first) step in Modification Example 6 of the method of manufacturing a semiconductor device according to Embodiment 1.
Figure 27:
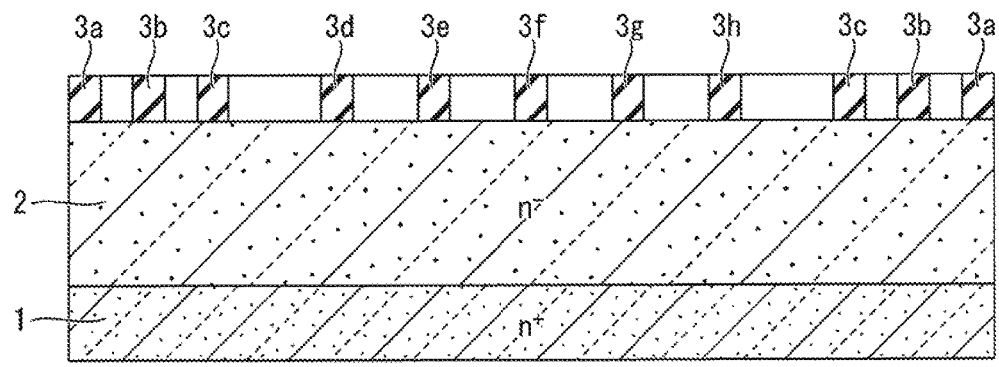
FIG. 27 is a cross-sectional view taken along the C-C direction in FIG. 26.

In a method of manufacturing a semiconductor device according to Modification Example 6, similar to in the step described with reference to FIG. 22 in Modification Example 5, an $SiO_2$ thin film or the like on the upper surface of the semiconductor substrate (1, 2) is patterned to form a first ring-shaped mask 3a, a second ring-shaped mask 3b, and a third ring-shaped mask 3c in the same manner. However, Modification Example 6 differs from Modification Example 5 in that as illustrated in FIG. 26, a patterning process is used to further form a first line-shaped mask 3d, a second line-shaped mask 3e, a third line-shaped mask 3f, a fourth line-shaped mask 3g, and a fifth line-shaped mask 3h having substantially the same width and extending parallel to one another in the vertical direction at substantially equidistant intervals on the inner side of the third ring-shaped mask 3c as selective formation masks. As illustrated in FIG. 27, the upper surface of the to-be-doped layer 2 is exposed between the respective adjacent masks among the first to third ring-shaped masks 3a, 3b, 3c and the first to fifth line-shaped masks 3d, 3e, 3f, 3g, 3h.

Figure 28:
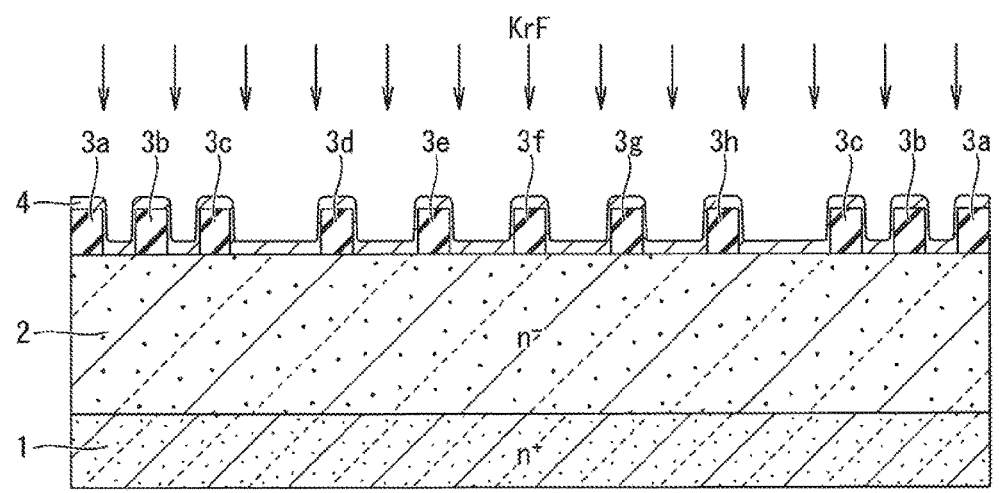
FIG. 28 is a cross-sectional view schematically illustrating a (second) step in Modification Example 6 of the method of manufacturing a semiconductor device according to Embodiment 1.

Next, as illustrated in FIG. 28, an impurity source film 4 is deposited spanning across the upper surface of the to-be-doped layer 2 and across the respective upper surfaces of the first to third ring-shaped masks 3a, 3b, 3c and the first to fifth line-shaped masks 3d, 3e, 3f, 3g, 3h. Then, the impurity source film 4 is irradiated with laser light from the upper side thereof to introduce both Al and Be into the to-be-doped layer 2 at the same time.

Figure 29:
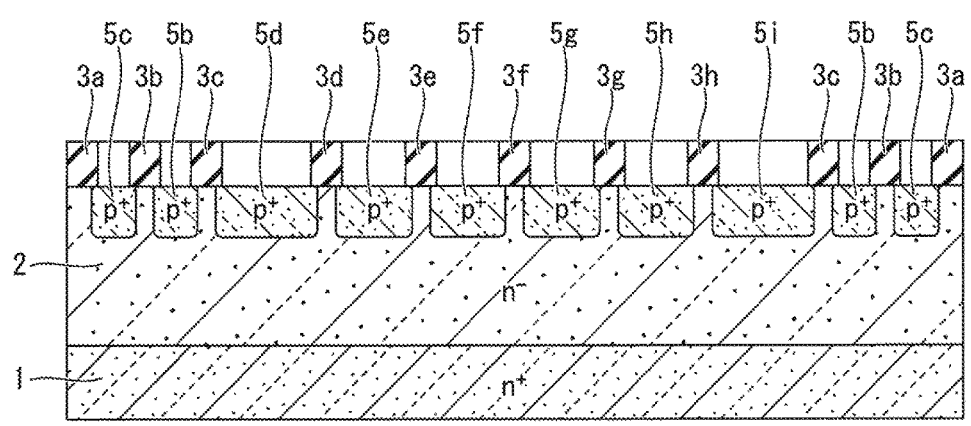
FIG. 29 is a cross-sectional view schematically illustrating a (third) step in Modification Example 6 of the method of manufacturing a semiconductor device according to Embodiment 1.

As illustrated in FIG. 29, due to the first to fifth line-shaped masks 3d, 3e, 3f, 3g, 3h, six to-be-doped layers including a first line-shaped impurity-doped layer 5d, a second line-shaped impurity-doped layer 5e, a third line-shaped impurity-doped layer 5f, a fourth line-shaped impurity-doped layer 5g, a fifth line-shaped impurity-doped layer 5h and a sixth line-shaped impurity-doped layer 5i are separately formed in the upper portion of the to-be-doped layer 2 on the inner side of the third ring-shaped mask 3c. Moreover, similar to in Modification Example 5, a first ring-shaped impurity-doped layer 5b and a second ring-shaped impurity-doped layer 5c are formed in the upper portion of the to-be-doped layer 2 on the outer side of the first to sixth line-shaped impurity-doped layers 5d, 5e, 5f, 5g, 5h, 5i.

As can be deduced from the line and space shaped mask pattern in the center in FIG. 26, the first to sixth line-shaped $p^+$ impurity-doped layers 5d, 5e, 5f, 5g, 5h, 5i, which are each line-shaped or band-shaped, are arranged parallel to one another at substantially equidistant intervals in the active portion of the semiconductor device. The active portion functions as a junction barrier Schottky (JBS) structure. The method of manufacturing a semiconductor device according to Modification Example 6 makes it possible to efficiently manufacture a JBS diode having impurity-doped layers and FLR structures in which p-type impurities are introduced at high concentration down to positions deep from the surface side.

MODIFICATION EXAMPLE 7

Figure 30:
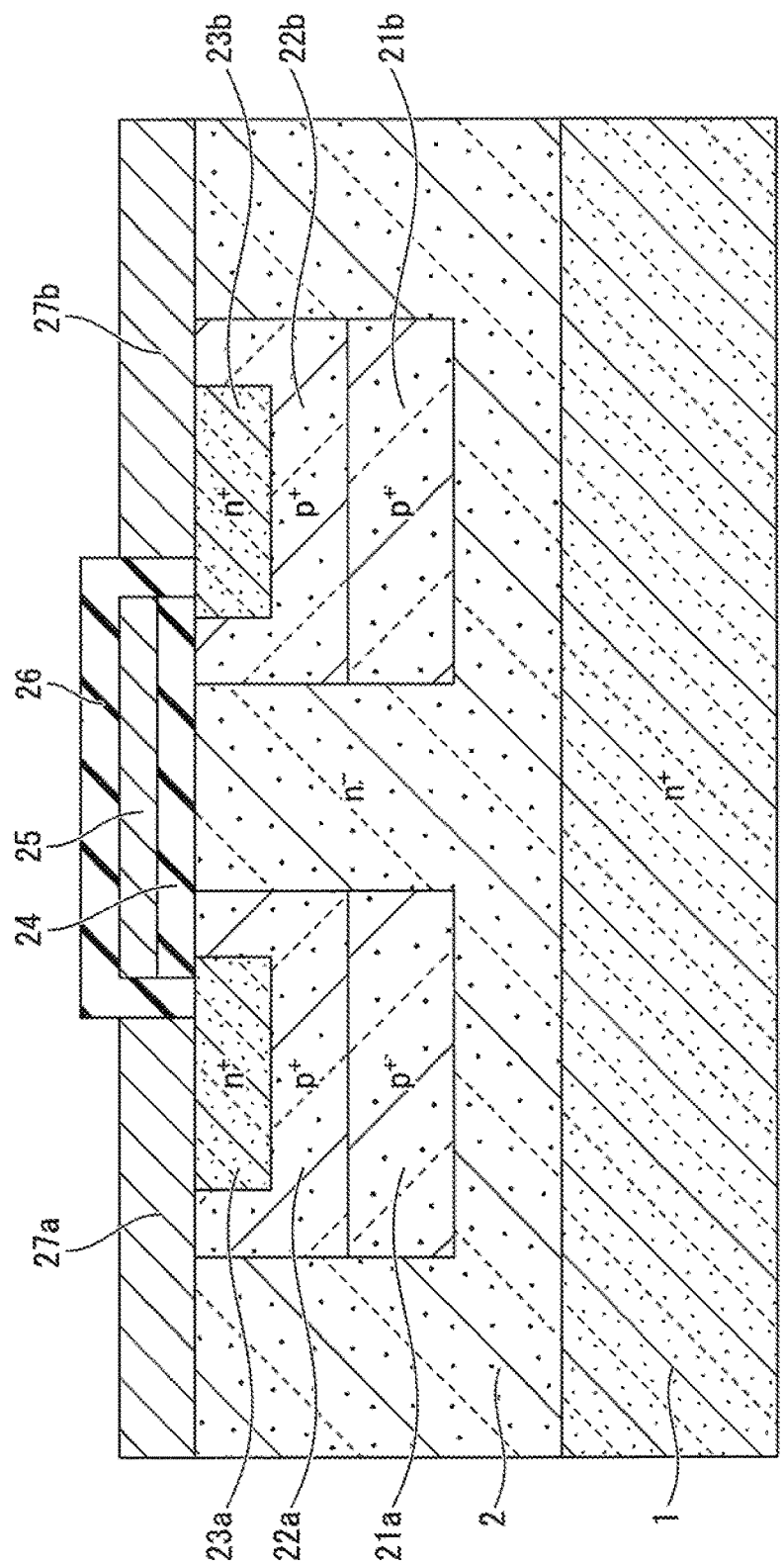
FIG. 30 is a cross-sectional view schematically illustrating a (first) step in Modification Example 7 of the method of manufacturing a semiconductor device according to Embodiment 1.

In a method of manufacturing a semiconductor device according to Modification Example 7, first, as illustrated in FIG. 30, the semiconductor substrate (1, 2) illustrated in FIG. 1 is prepared, and a MOS field-effect transistor (FET) structure is formed in the upper portion of the semiconductor substrate (1, 2). In Modification Example 7, an insulated-gate bipolar transistor (IGBT) is manufactured as the semiconductor device. The $n^+$ supporting layer 1 and then to-be-doped layer 2 are made of SiC having a 4H crystal structure. The thickness of the supporting layer 1 can be set as appropriate to any thickness that does not impede formation of the MOSFET structure. Here, similar to when manufacturing the power p-n diode, the thickness of the supporting layer 1 may be approximately 350 µm. The thickness of the to-be-doped layer 2 is set to a thickness according to the desired breakdown voltage for the IGBT.

A plurality of first $p^+$ base regions 21a and 21b are selectively formed in the upper portion (on the Si plane side) of the to-be-doped layer 2 using an ion implantation process, second $p^+$ base regions 22a and 22b are respectively selectively formed on the first base regions 21a and 21b using an epitaxial growth process. In other words, the MOSFET structure in the upper portion of the semiconductor device according to Modification Example 7 is an implantation and epitaxial (IE) MOS structure which prevents roughening of the upper surfaces of the first base regions 21a and 21b and the decrease in channel mobility.

n+ emitter regions 23a and 23b each having a high impurity concentration are respectively selectively formed in the upper portions of the second base regions 22a and 22b. On the upper surface of the to-be-doped layer 2 between the adjacent emitter regions 23a and 23b, a gate electrode 25 is formed with a gate insulating film 24 interposed therebeneath. An interlayer insulating film 26 is formed on the upper surfaces of the emitter regions 23a and 23b and on the upper surface of the gate electrode 25. Contact electrodes 27a and 27b connected to the emitter regions 23a and 23b are respectively formed on the upper surface of the to-be-doped layer 2.

Figure 31:
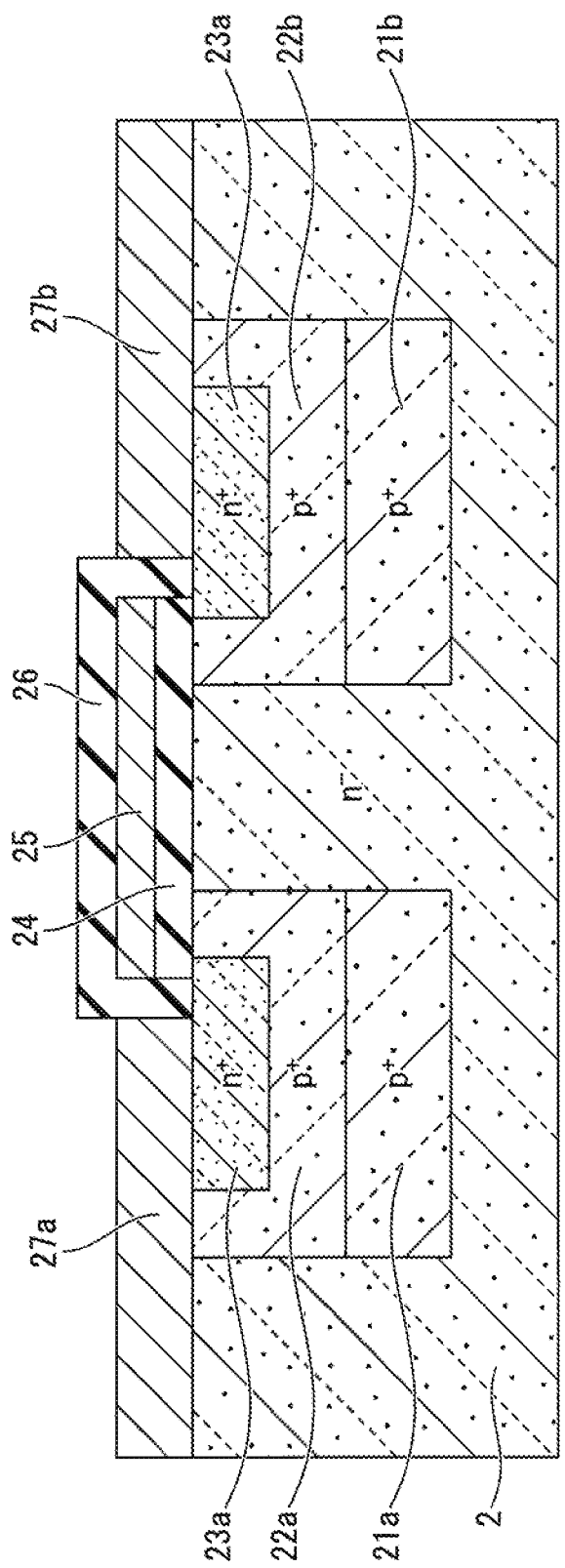
FIG. 31 is a cross-sectional view schematically illustrating a (second) step in Modification Example 7 of the method of manufacturing a semiconductor device according to Embodiment 1.
Figure 32:
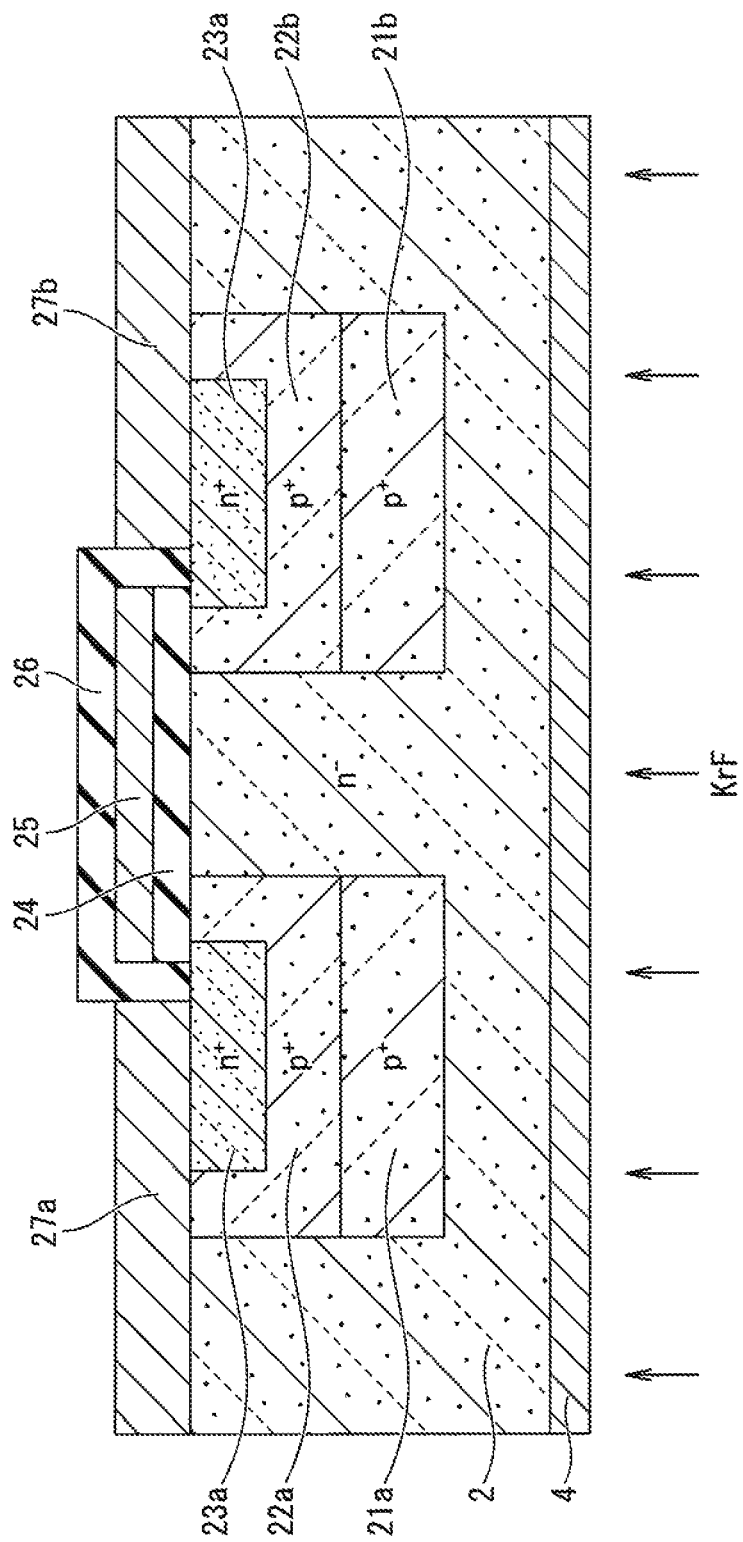
FIG. 32 is a cross-sectional view schematically illustrating a (third) step in Modification Example 7 of the method of manufacturing a semiconductor device according to Embodiment 1.
Figure 33:
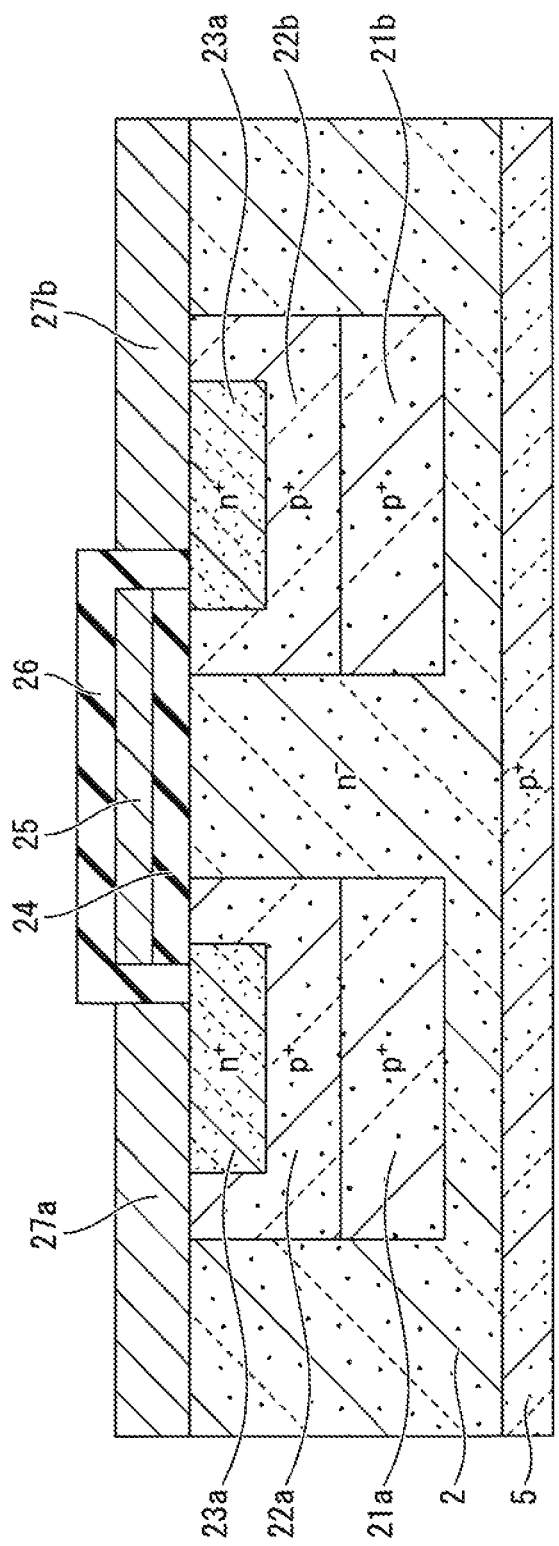
FIG. 33 is a cross-sectional view schematically illustrating a (fourth) step in Modification Example 7 of the method of manufacturing a semiconductor device according to Embodiment 1.

Next, as illustrated in FIG. 31, the supporting layer 1 is removed by performing a process such as grinding, polishing, or etching on the bottom (the C-plane side) of the semiconductor substrate (1, 2). The removal of the supporting layer 1 makes the semiconductor substrate (1, 2) thinner and yields an intermediate structure in which the bottom surface of the to-be-doped layer 2 is exposed. Then, as illustrated in FIG. 32, an impurity source film 4 is formed on the exposed bottom surface of the to-be-doped layer 2. Next, similar to in the step described with reference to FIG. 4, the impurity source film 4 is irradiated with laser light using a KrF laser light source with a wavelength of 248 nm. As illustrated in FIG. 33, this irradiation with laser light results in formation of a p+ impurity-doped layer 5 on the bottom of the to-be-doped layer 2. Then, a plasma treatment or the like is performed to remove any residue on the bottom surface of the to-be-doped layer 2.

Figure 34:
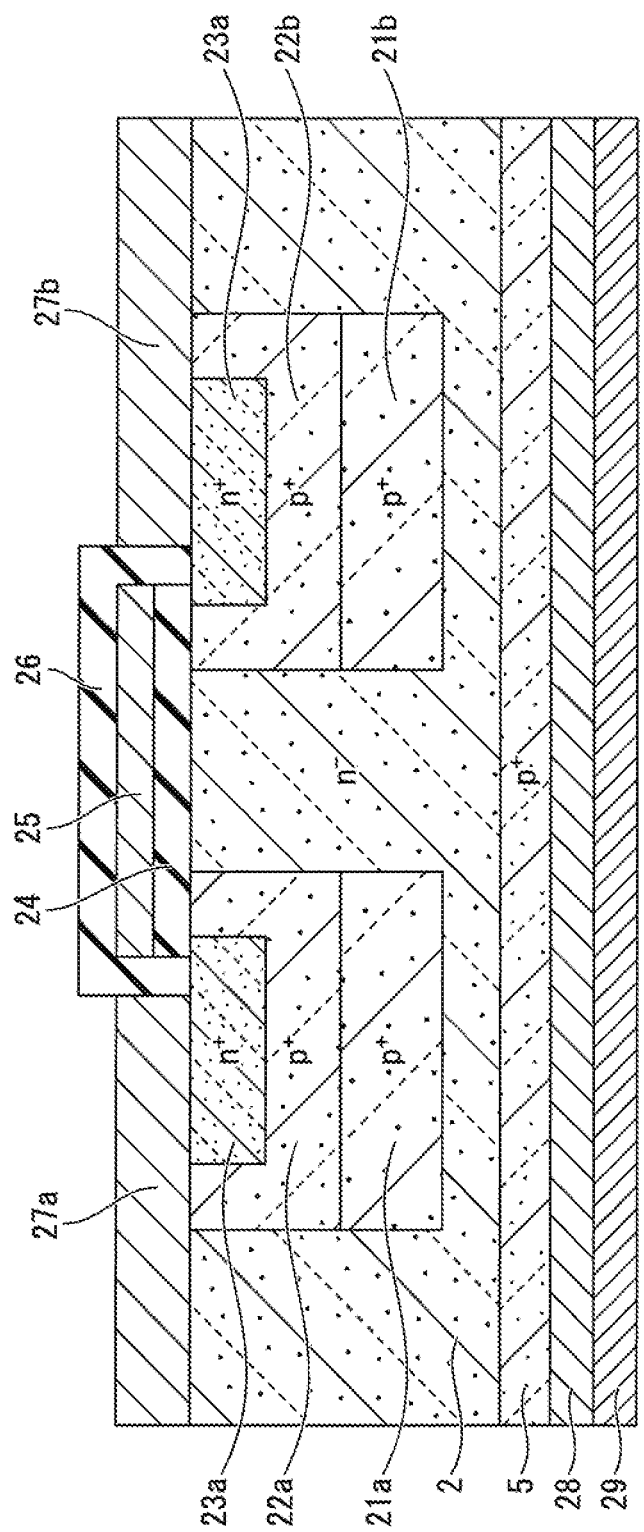
FIG. 34 is a cross-sectional view schematically illustrating a (fifth) step in Modification Example 7 of the method of manufacturing a semiconductor device according to Embodiment 1.

Next, using a sputtering process or the like, a metal film containing Ti and Al is deposited on the bottom surface of the impurity-doped layer 5. Then, as illustrated in FIG. 34, the intermediate structure having this metal film on the bottom surface thereof is vacuum-annealed at approximately 1000° C. for approximately 5 minutes to form, on the bottom surface of the p+ impurity-doped layer 5, a third ohmic contact electrode 28 connected to that impurity-doped layer 5. Next, a metal film containing Ni, Au and the like is formed as a collector electrode 29 on the bottom surface of the third ohmic contact electrode 28.

The method of manufacturing a semiconductor device according to Modification Example 7 makes it possible to efficiently manufacture an IGBT having, as a collector region, the impurity-doped layer 5 in which p-type impurities are introduced at high concentration down to positions deep from the surface side. Moreover, using the laser doping process of the method of manufacturing a semiconductor device according to Modification Example 7 makes it possible to easily introduce p-type impurities at high concentration into a thin semiconductor substrate, which has conventionally been difficult to do.

COMPARISON EXAMPLE 4

In a method of manufacturing a semiconductor device according to Comparison Example 4, an IGBT is manufactured having a collector region formed by laser doping using a thin film of only Al instead of using an impurity source film. In Comparison Example 4, the steps other than forming a thin film as the impurity source film are the same as in the method of manufacturing a semiconductor device described with reference to FIGS. 1 to 8.

As described in Comparison Example 2, the impurity diffusion coefficient of Al is extremely small compared to that of Be, and therefore it is difficult to introduce high concentrations of Al down to deep positions in SiC even when using laser doping. Moreover, research conducted by the present inventors revealed that when using a thin film of only Al, there tend to be irregularities in the distribution of Al within the laser light irradiation plane. Therefore, IGBTs manufactured with the method of manufacturing a semiconductor device according to Comparison Example 4 have a large number of crystal defects within the Al-doped layers and exhibit increased leakage current due to these crystal defects. In contrast, in the method of manufacturing a semiconductor device according to Modification Example 7, both Al and Be are used to be implanted into and activated within the to-be-doped layer 2 of SiC at the same time, thereby making it possible to introduce p-type impurities at high concentration down to deep positions.

Embodiment 2

Figure 35:
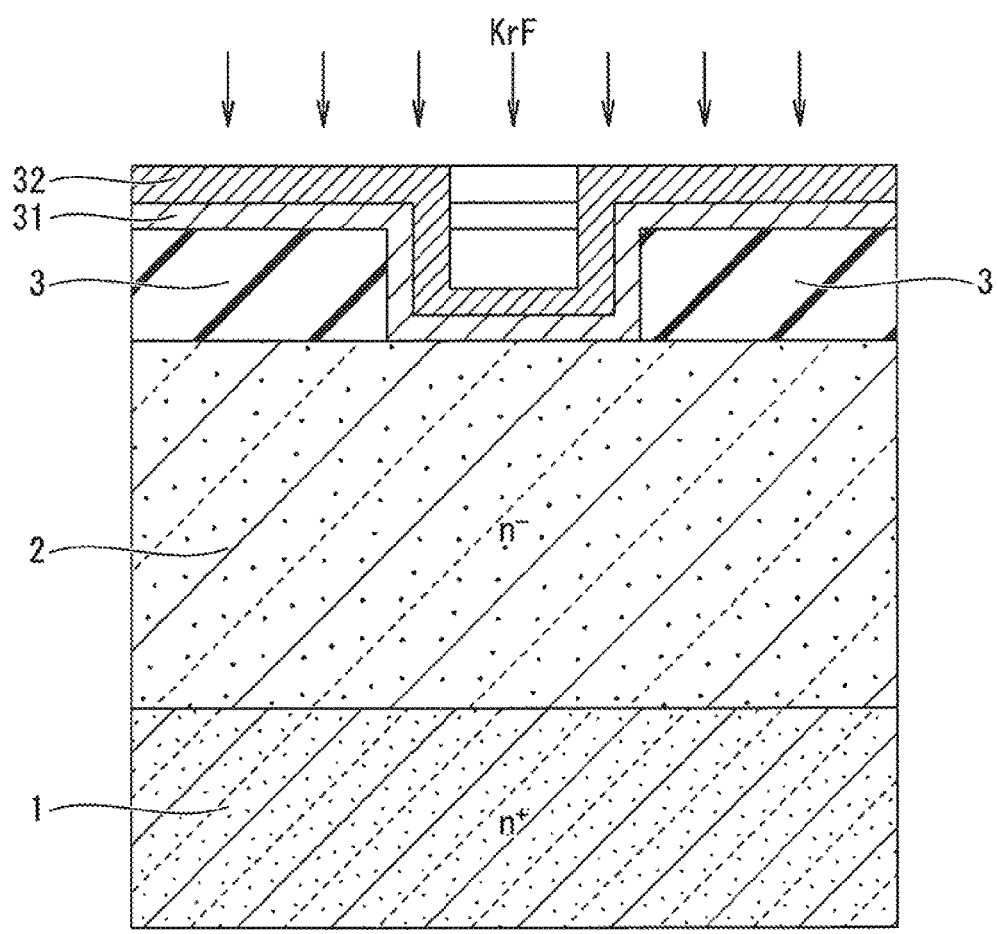
FIG. 35 is a cross-sectional view schematically illustrating a step in a method of manufacturing a semiconductor device according to Embodiment 2 of the present invention.

In a method of manufacturing a semiconductor device according to Embodiment 2, similar to in Embodiment 1, a power p-n diode as illustrated in FIG. 8 is manufactured as an SiC semiconductor device. As illustrated in FIG. 35, in the method of manufacturing a semiconductor device according to Embodiment 2, a multilayer film (31, 32) including a beryllium layer (Be layer) 31 and an aluminum layer (Al layer) 32 is used as the impurity source film containing both Al and Be as impurity elements. The method of manufacturing a semiconductor device according to Embodiment 2 thus differs from the method of manufacturing a semiconductor device according to Embodiment 1 in that the impurity source film is the multilayer film (31, 32) instead of the impurity source film being a single-layer film.

In the method of manufacturing a semiconductor device according to Embodiment 2 as well, the impurity source film constituted by the multilayer film (31, 32) is deposited on the upper surface of the n− to-be-doped layer 2, and then the impurity source film is irradiated with laser light. Next, the Al and Be are heated at the same time in order to introduce both of these elements into the to-be-doped layer 2 at the same time, thereby forming a high-concentration p-type impurity-doped layer. The steps other than formation of the impurity source film are the same as the respective manufacturing steps in Embodiment 1 and therefore will not be described again here.

The multilayer film (31, 32) serving as the impurity source film is, more specifically, a two-layer film in which the Be layer 31 and the Al layer 32 are laminated in this order onto the upper surface of the to-be-doped layer 2; these layers can be formed using a process such as sputtering, vacuum deposition, or CVD. The thickness of the Be layer 31 is, in consideration of doping efficiency, generally set to approximately 30 nm to approximately 100 nm. The thickness of the Al layer 32 is, again in consideration of doping efficiency, generally set to approximately 240 nm to approximately 500 nm.

Similar to Embodiment 1, the method of manufacturing a semiconductor device according to Embodiment 2 makes it possible to efficiently manufacture a semiconductor device having an impurity-doped layer in which p-type impurities are introduced at high concentration down to positions deep from the surface side. Moreover, in the impurity source film constituted by the multilayer film (31, 32) used in Embodiment 2, the Be layer 31 is formed beneath the Al layer 32 so as to be in contact with the SiC. Be atoms are smaller than Al atoms, which makes it possible to accelerate the binding reaction with the Si or with C in the SiC during laser doping and is advantageous from a process perspective.

MODIFICATION EXAMPLE 8

Figure 36:
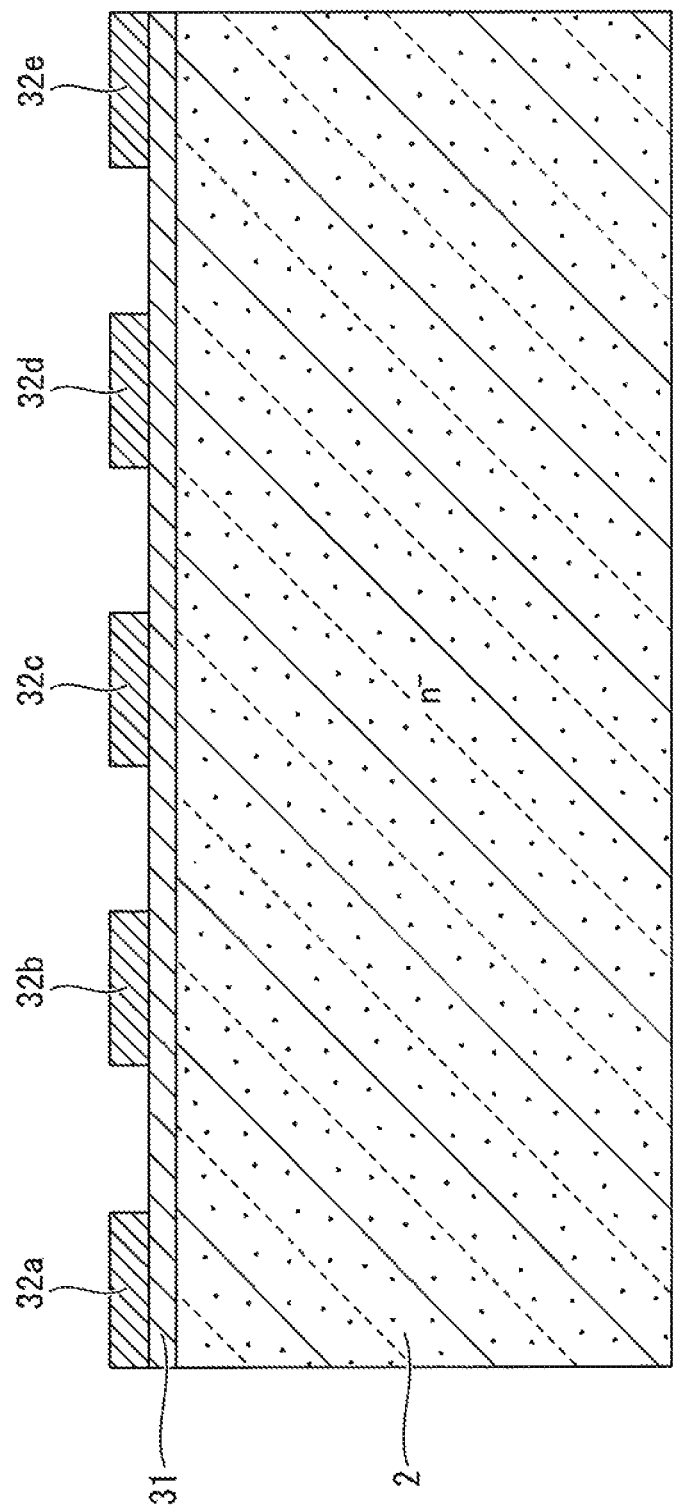
FIG. 36 is a cross-sectional view schematically illustrating a (first) step in a modification example (Modification Example 8) of the method of manufacturing a semiconductor device according to Embodiment 2.

As illustrated in FIG. 36, in a modification example (Modification Example 8) of the method of manufacturing a semiconductor device according to Embodiment 2, the Al layer on upper side of the Be layer 31 is patterned to be divided into five regions including a first region 32a, a second region 32b, a third region 32c, a fourth region 32d, and a fifth region 32e. The first to fifth regions 32a, 32b, 32c, 32d, 32e are arranged separated by substantially equidistant intervals. The impurity source film used in Modification Example 8 is a multilayer film (31, 32a to 32e) including this patterned Al layer and is deposited directly on the upper surface of then to-be-doped layer 2 with no mask interposed therebeneath.

Figure 37:
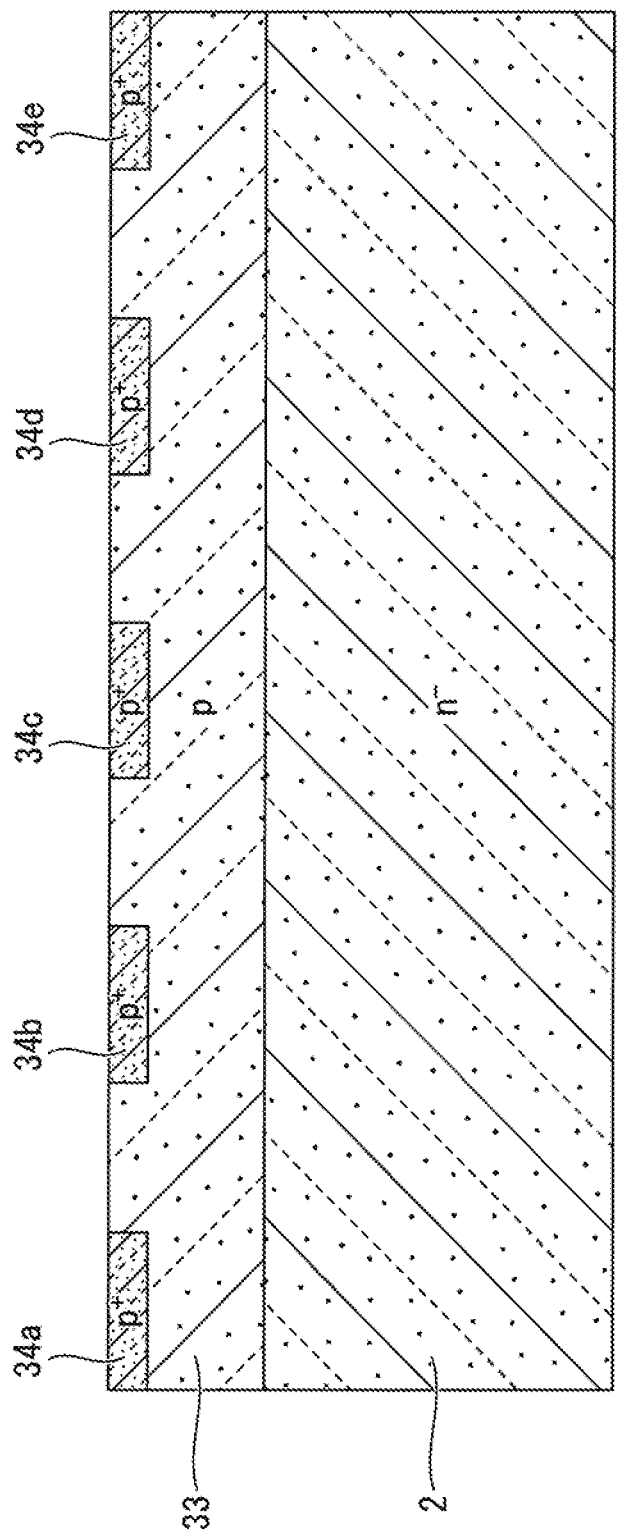
FIG. 37 is a cross-sectional view schematically illustrating a (second) step in the modification example (Modification Example 8) of the method of manufacturing a semiconductor device according to Embodiment 2.

As illustrated in FIG. 37, the multilayer film (31, 32a to 32e) is irradiated with laser light from the upper side thereof to form a deep impurity-doped layer 33 in the upper portion of the to-be-doped layer 2. Moreover, a first surface impurity-doped layer 34a, a second surface impurity-doped layer 34b, a third surface impurity-doped layer 34c, a fourth surface impurity-doped layer 34d, and a fifth surface impurity-doped layer 34e are selectively formed in the upper portion of the deep impurity-doped layer 33. The first to fifth surface impurity-doped layers 34a, 34b, 34c, 34d and 34e are, due primarily to the introduction of Al, formed to be relatively shallow and exhibit a high $p^+$ concentration.

The deep impurity-doped layer 33 is, due primarily to the introduction of Be, formed to be relatively deep and exhibits a lower concentration of p-type impurities than the first to fifth surface impurity-doped layers 34a, 34b, 34c, 34d and 34e. The first to fifth surface impurity-doped layers 34a, 34b, 34c, 34d and 34e can be used as high-impurity concentration p-type contact regions, for example. Moreover, the deep impurity-doped layer 33 can be used as a p-type base region.

The method of manufacturing a semiconductor device according to Modification Example 8 makes it possible to, by laser doping using the multilayer film (31, 32a to 32e) including the patterned Al layer as the impurity source film, form a p-type impurity-doped layer having an arbitrary cross-sectional profile. Moreover, this method makes it possible to form the high-concentration first to fifth $p^+$ surface impurity-doped layers 34a, 34b, 34c, 34d and 34e positioned on the surface side and the thicker p-type deep impurity-doped layer 33 positioned in a deeper location within the introduction layer 2 at the same time using a single-shot laser doping process.

Other Embodiments

Although the present invention was described with reference to the above Embodiments 1 and 2 and modification examples thereof, the descriptions or drawings of this disclosure should not be understood to limit the present invention in any way. It should instead be understood that various alternative embodiments, examples, and applied technologies would be obvious to a person skilled in the art based on this disclosure. For example, although the methods of manufacturing a semiconductor device according to Embodiments 1 and 2 were described as using an SiC semiconductor substrate (1, 2) as an example, the semiconductor substrate (1, 2) is not limited to being made of SiC. Even when using another semiconductor such as Si, using both Al and Be to implant and activate Al and Be within the to-be-doped layer at the same time still makes it possible to introduce p-type impurities at high concentration down to positions deep from the surface side.

Moreover, although the crystal structure of the SiC was described as being monocrystalline 4H-SiC as an example, the crystal structure is not limited to this example and may be a monocrystalline 6H or 3C structure or a polycrystalline structure. Furthermore, prior to being irradiated with laser light, the semiconductor substrate (1, 2) may be heated to further promote simultaneous diffusion of the Al and Be in order to introduce impurities more deeply and at higher concentration. However, in consideration of the approximately 660° C. melting point of Al, in the present invention it is preferable that an upper limit of approximately 400° C. be set on the temperature of such a heating process in order to avoid softening of the impurity source film and keep the impurity source film in a solid state to ensure the effective laser doping.

In addition, in Embodiment 1 as described with reference to FIGS. 6 to 8, the first metal film 6 is patterned on the upper surface of the impurity-doped layer 5 and then vacuum-annealed to form the first ohmic contact electrode 6a, and then the second metal film 7 is formed on the bottom surface of the supporting layer 1. However, prior to performing the vacuum-annealing process, the second metal film 7 may be formed on the bottom surface of the supporting layer 1 while still in the state in which the first metal film 6 has only been patterned on the upper surface of the impurity-doped layer 5. Then, both the first ohmic contact electrode 6a and the second ohmic contact electrode 7a may be formed from the first metal film 6 and the second metal film 7, respectively, at the same time by performing a single vacuum-annealing process. Completing the vacuum-annealing in a single process in this manner makes it possible to reduce the number of manufacturing processes.

Moreover, in the multilayer film used in the method of manufacturing a semiconductor device according to Embodiment 2, the Be layer 31 is on the bottom side (the SiC side) and the Al layer 32 is on the top side. However, the present invention is not limited to this example, and the effects of the present invention can still be achieved even if the top and bottom relationship is reversed such that the Al layer 32 is on the bottom side and the Be layer 31 is on the top side. Furthermore, the multilayer film can include layers other than the Be layer 31 and the Al layer 32 and may include three or more layers.

In addition, Embodiment 1 described the manufactured semiconductor device as being a power p-n diode in which the p-type impurity-doped layer is used as an anode layer, and Modification Example 7 described the manufactured semiconductor device as being an IGBT in which the impurity-doped layer is used as a collector region. However, the p-type impurity-doped layer can also be applied to other structures, such as the p-wells of a MOSFET, for example, and the semiconductor device manufactured is not limited to being a power p-n diode or an IGBT.

Moreover, steps included in the respective methods of manufacturing a semiconductor device illustrated in FIGS. 1 to 37 can be partially combined to achieve the method of manufacturing a semiconductor device according to the present invention. As described above, the present invention includes various other embodiments and the like that are not explicitly described above. Furthermore, the technical scope of the present invention is defined only by the characterizing features of the invention according to the claims, which are derived as appropriate from the descriptions above.

What is claimed is:

1. A method of manufacturing a semiconductor device, comprising:

forming, on a surface of an n-type semiconductor layer, an impurity source film containing both aluminum and beryllium; and forming a p-type impurity-doped layer in the n-type semiconductor layer by irradiating the impurity source film with first laser light to simultaneously introduce the aluminum and the beryllium into the n-type semiconductor layer.

2. The method of manufacturing a semiconductor device according to claim 1, wherein the impurity source film is a single-layer film.

3. The method of manufacturing a semiconductor device according to claim 2, wherein the impurity source film contains 0.1 atomic percent to 5 atomic percent of the beryllium.

4. The method of manufacturing a semiconductor device according to claim 2, wherein the impurity source film has a thickness of 30 nm to 1 μm.

5. The method of manufacturing a semiconductor device according to claim 1, wherein the impurity source film is a multilayer film in which an aluminum layer and a beryllium layer are laminated together.

6. The method of manufacturing a semiconductor device according to claim 5, wherein the multilayer film is a two-layer film in which the beryllium layer and the aluminum layer are laminated in that order on the surface of the n-type semiconductor layer.

7. The method of manufacturing a semiconductor device according to claim 1, wherein the irradiation with the first laser light is performed in a vacuum or in an inert gas.

8. The method of manufacturing a semiconductor device according to claim 1, further comprising:

forming a metal film on a bottom surface of a supporting layer that is formed beneath the n-type semiconductor layer; and irradiating the formed metal film with second laser light to promote silicidation between the metal film and the supporting layer.

9. The method of manufacturing a semiconductor device according to claim 1, further comprising:

before forming the impurity source film, forming, on an upper surface of the n-type semiconductor layer, a mask for defining a region where the p-type impurity-doped layer is to be formed, wherein in the subsequent step of forming the impurity source film, the impurity source film is formed on the mask;

after irradiating with the first laser light, removing the mask to remove a residue of the impurity source film from the upper surface of the n-type semiconductor layer; and forming a contact electrode on the upper surface of the n-type semiconductor layer from which the residue of the impurity source film has been removed.

10. The method of manufacturing a semiconductor device according to claim 1, further comprising:

forming a metal film on a bottom surface of a supporting layer formed beneath the n-type semiconductor layer; and forming a Schottky contact electrode by heating the formed metal film and the supporting layer.

11. The method of manufacturing a semiconductor device according to claim 1, wherein the p-type impurity-doped layer formed in the n-type semiconductor layer has a ring shape as seen in a plan view.

12. The method of manufacturing a semiconductor device according to claim 1, wherein the p-type impurity-doped layer formed in the n-type semiconductor layer has a plurality of line-shaped regions arranged parallel to one another with gaps therebetween in a plan view.

13. The method of manufacturing a semiconductor device according to claim 1, wherein the n-type semiconductor layer is made of a silicon carbide semiconductor.

14. The method of manufacturing a semiconductor device according to claim 13, wherein the silicon carbide semiconductor has any one of a 4H, 6H, or 3C monocrystalline structure or a polycrystalline structure.

15. The method of manufacturing a semiconductor device according to claim 1, wherein the first laser light has a wavelength of greater than or equal to 190 nm.

16. The method of manufacturing a semiconductor device according to claim 1, wherein a pulse width of the first laser light is 50 nanoseconds to 1 microsecond.

* * * * *